US012361187B1

(12) United States Patent
Khain et al.

(10) Patent No.: US 12,361,187 B1
(45) Date of Patent: Jul. 15, 2025

(54) SYSTEM, METHOD AND COMPUTER PROGRAM PRODUCT FOR REGION SPECIFIC SIMULTANEOUS LOCALIZATION AND MAPPING

(71) Applicant: CYBERBEE LTD, Rosh Ha'Ayin (IL)

(72) Inventors: Max Khain, Tel Aviv (IL); Dan Soloder, Habsor (IL)

(73) Assignee: CYBERBEE LTD, Rosh Ha'Ayin (IL)

( * ) Notice: Subject to any disclaimer, the term of this patent is extended or adjusted under 35 U.S.C. 154(b) by 0 days.

(21) Appl. No.: 18/941,172

(22) Filed: Nov. 8, 2024

(30) Foreign Application Priority Data

May 7, 2024 (IL) .......................................... 312685

(51) Int. Cl.
*G06F 30/13* (2020.01)
(52) U.S. Cl.
CPC .................................... *G06F 30/13* (2020.01)
(58) Field of Classification Search
CPC ................................. G06F 30/00; G06F 30/13
USPC .............................................................. 703/1
See application file for complete search history.

(56) References Cited

U.S. PATENT DOCUMENTS

| | | | |
|---|---|---|---|
| 11,481,925 B1 * | 10/2022 | Li | G06T 7/75 |
| 2019/0178654 A1 | 6/2019 | Hare | |
| 2020/0284587 A1 | 9/2020 | Hare | |
| 2021/0279964 A1 | 9/2021 | Laganakos et al. | |
| 2024/0160797 A1 * | 5/2024 | Narayana | G06V 10/82 |

OTHER PUBLICATIONS

Castillo, Eduardo Ismael Montemayor, "Hyperparameter Optimization for SLAM: An Approach for Enhancing ORB-SLAM2's Performance", 2022, Department of Computing Science, University of Alberta. (Year: 2022).*
Zheng, Shuran et al., "Simultaneous Localization and Mapping (SLAM) for Autonomous Driving: Concept and Analysis", Feb. 20, 2023, Remote Sensing, MDPI. (Year: 2023).*
Hong, Ziyang et al., "RadarSLAM: A Robust Simultaneous Localization and Mapping System for All Weather Conditions", 2022, The International Journal of Robotics Research, vol. 41(5), Sage. (Year: 2022).*
Eduardo Ismael Montemayor Castillo "Hyperparameter Optimization for SLAM: An Approach for Enhancing ORB-SLAM2's Performance".

(Continued)

*Primary Examiner* — Cedric Johnson
(74) *Attorney, Agent, or Firm* — Whitestone Law, PLLC

(57) ABSTRACT

Some embodiments are directed toward a computerized method for configuring navigation computer code for a SLAM based system. The method can include applying SLAM to recordings of a visual data (VD) collector traversing the region at different operation conditions using a variety of sets of SLAM parameter values, generating corresponding trajectories assessing collection movements of the collector within the region; evaluating performance of the different sets of SLAM parameter values under that different operational conditions, based on accuracy of the respective trajectories with respect to a 3D model; based at least on the plurality of performance evaluations for the different operational conditions, determining an operational set of SLAM parameter values for a SLAM-based system; and providing the operational set of SLAM parameter values to the SLAM-based system equipped with VD processor.

34 Claims, 8 Drawing Sheets

(56) References Cited

OTHER PUBLICATIONS

Optimization of SLAM Gmapping based on Simulation Werede Gunaza Teame, International Journal of Engineering Research & Technology (IJERT) ISSN: 2278-0181 Vol. 9 Issue 04, Apr. 2020 pp. 74-81.
Jul. 29, 2024, IPO Search Report.

* cited by examiner

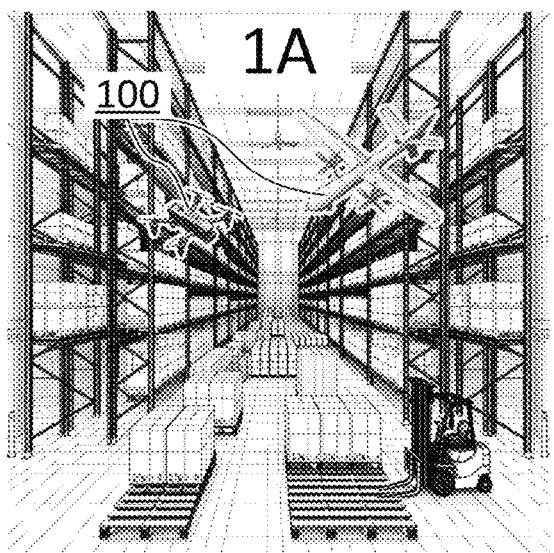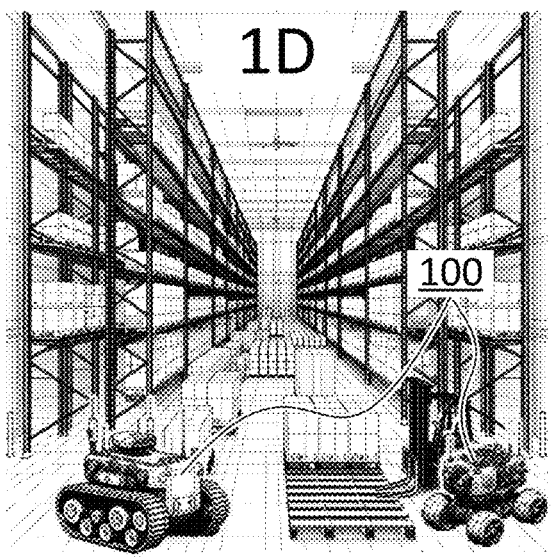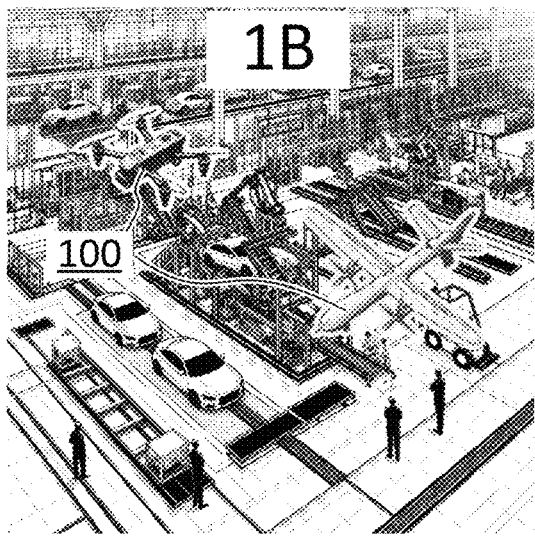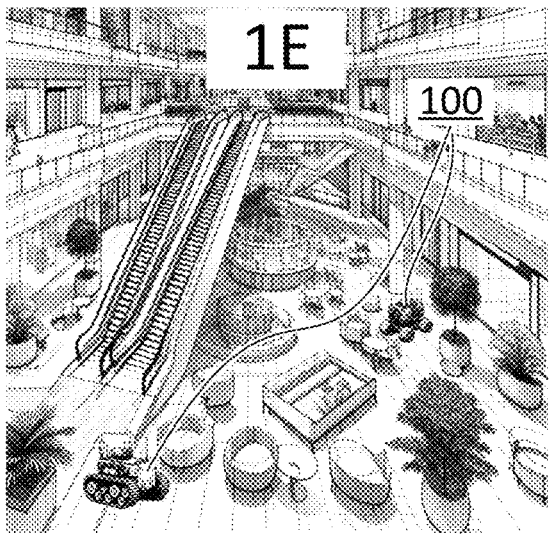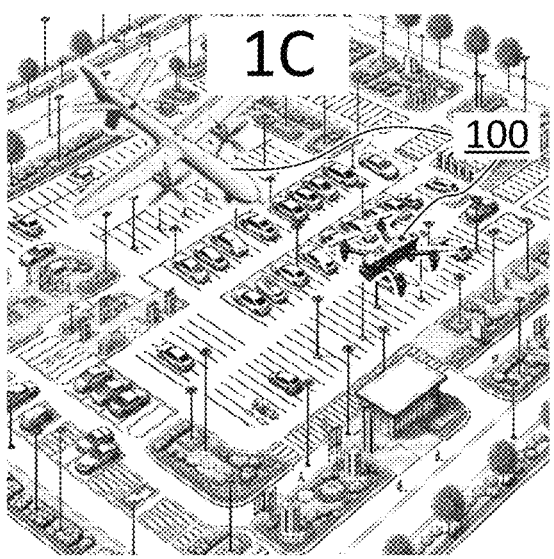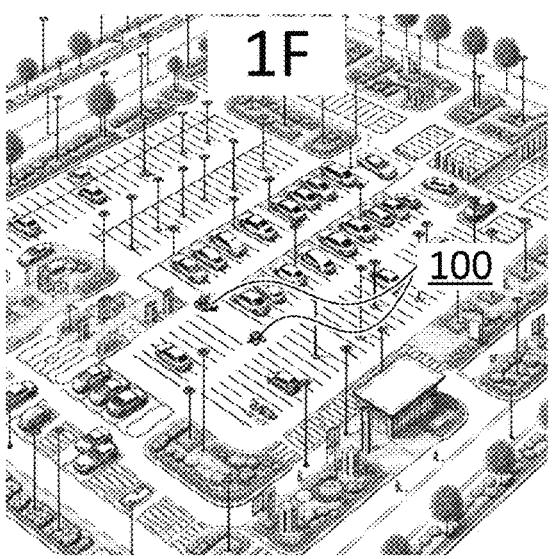
FIG. 1

610 Executing method 500 for determining a first operational set of SLAM parameter values optimized for (a) execution by a class of SLAM-based systems equipped with a VD processor of a VD processor class, and for (b) navigating within a first type of region

620 Executing method 500 for determining a second operational set of SLAM parameter values optimized for (a) execution by the class of SLAM-based systems equipped with the VD processor of the VD processor class, and for (b) navigating within a second type of region

630 Providing the first operational set of SLAM parameter values to a first SLAM-based system belonging to the class of SLAM-based systems for navigating within regions belonging to the first type of region by executing SLAM computer readable code by a first VD processor of the VD processor class using the first operational set of SLAM parameter values

640 Providing the second operational set of SLAM parameter values to a second SLAM-based system belonging to the class of SLAM-based systems for navigating within regions belonging to the second type of region by executing SLAM computer readable code by a second VD processor of the VD processor class using the second operational set of SLAM parameter values

650 Providing the first operational set of SLAM parameter values and the second operational set of SLAM parameter values to a single SLAM-based system belonging to the class of SLAM-based systems for alternately navigating within regions belonging to the first type of region and within regions belonging to the second type of region, by executing at least one body of SLAM computer readable code by a VD processor of the VD processor class using the first operational set of SLAM parameter values and the second operational set of SLAM parameter values

660 Alternatingly performing SLAM using the first operational set and performing SLAM using the second operational set <u>600</u>

FIG. 3

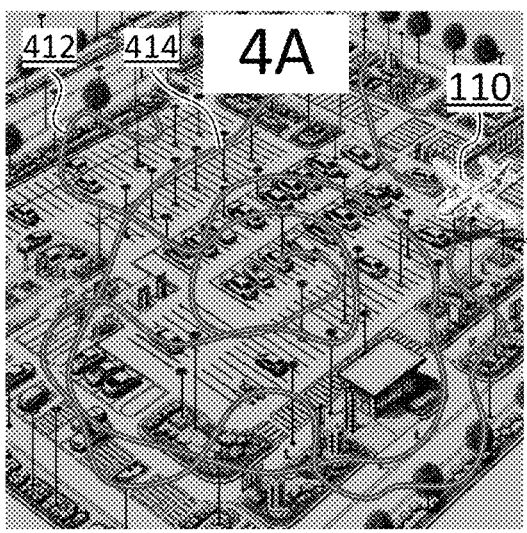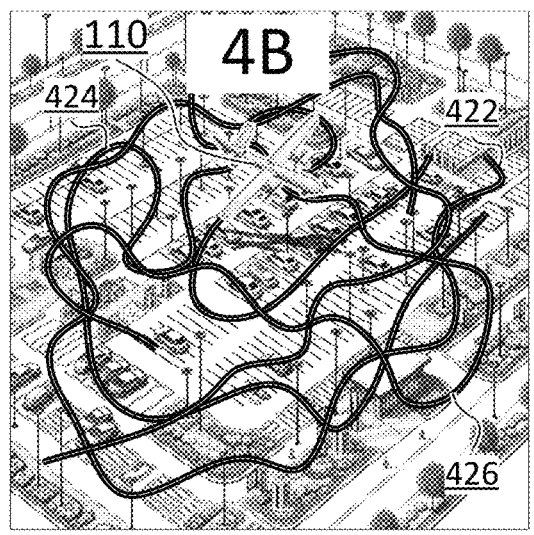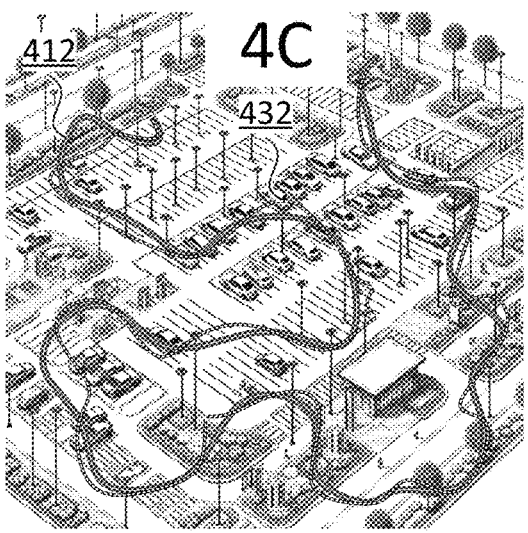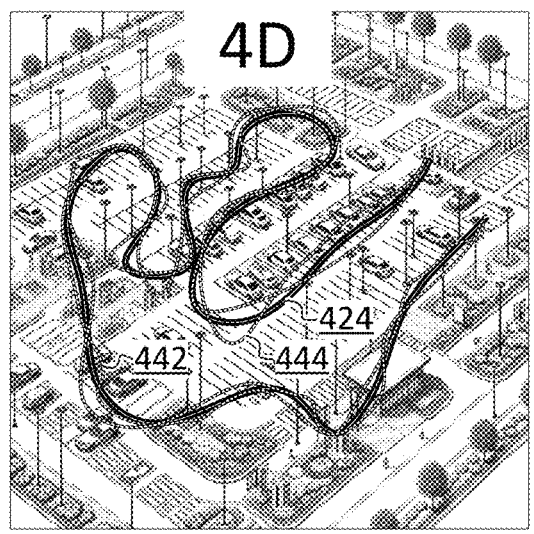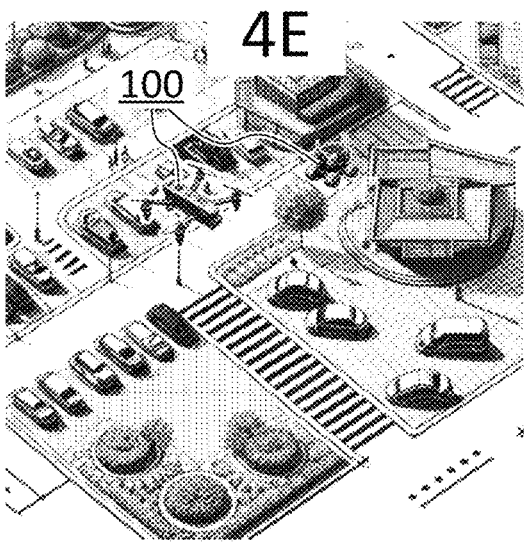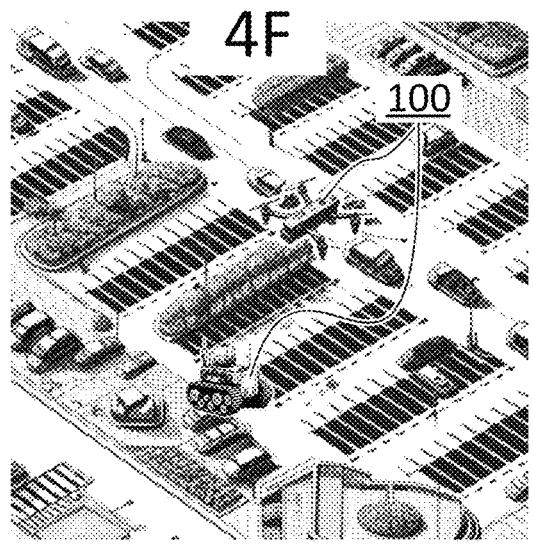
FIG. 4

SYSTEM, METHOD AND COMPUTER PROGRAM PRODUCT FOR REGION SPECIFIC SIMULTANEOUS LOCALIZATION AND MAPPING

CROSS-REFERENCE TO RELATED APPLICATIONS

The present disclosure claims the priority to Israeli patent application with the filing number 312685 filed on May 7, 2024, with the Israel Patent Office, the contents of which are incorporated herein by reference in entirety.

FIELD

The presently disclosed subject matter related to systems, methods, and computer program products for region specific simultaneous localization and mapping.

BACKGROUND

In His thesis submitted to University of Alberta for the degree of MSc entitled "Hyperparameter Optimization for SLAM: An Approach for Enhancing ORB-SLAM2's Performance", Mr. Eduardo Ismael Montemayor Castillo attempts to aims to devise a methodology that applies Hyperparameter Optimization (HPO) to Simultaneous Location and Mapping (SLAM) to reduce the absolute trajectory error produced and to increase performance by building a more accurate map. Specifically, it investigates whether the proposed methodology impacts error reduction on ORB-SLAM2. Mr. Castillo discusses training model-free, population-based algorithms in a modified KITTI benchmark to obtain an initial set of possible configurations and test them against model-free, search-based baseline algorithms. Mr. Castillo discusses use of a combination of 20 modified and unaltered sequences for performance evaluation. Four evaluation metrics (optimality, proximity, under-performance, and success rates) determine the efficacy of each candidate configuration. The proposed methodology outperformed a default configuration execution with an 80% success rate. The results promise case-specific executions. However, Mr. Castillo states that they could not find a universal hyperparameter set to reduce error in all test cases.

In light of the cited prior art, there remains a need for novel systems, methods, and computer program products for region specific simultaneous localization and mapping.

GENERAL DESCRIPTION

Simultaneous Localization and Mapping (SLAM) algorithms are pivotal in many technological fields such as robotics, autonomous driving, augmented reality, and industrial automation, and so on, particularly for autonomous navigation in diverse environments. These algorithms enable a robot, a vehicle, a passive SLAM-based system (e.g., which is carried by another system and does not propel itself and/or does not determine its course of progression in the environment), any other SLAM-based system or any other autonomously or semi-autonomously self-navigable system to concurrently build a map of an environment and find its own location within that map. The effectiveness of SLAM algorithms varies significantly based on the environment's characteristics and the capability of the SLAM-based system to identify and utilize SLAM features such as landmarks or distinct visual cues in that environment. For example, different environment may have more or less objects or features to base the navigation algorithm on, more or less obstacles, different illumination conditions (e.g., illumination levels, illumination diversity, illumination modulation in time), and so on.

The term "SLAM-based system" in the context of the present disclosure refers to an apparatus capable of autonomously mapping a designated region, based on: sensed visual data collected within the designated region, kinematic data associated with the collection of the visual data, and computational algorithms. SLAM-based systems in the context of the present disclosure may be further capable of autonomously determining and possibly also executing a travel path within the designated region. The mapping may include mapping region features (e.g., topography, roads), moving objects within the region (e.g., cars, other machines, people), and so on. Such a system may optionally be capable of autonomy in additional aspects beyond navigation, such as any combination of one or more of the following: task initiation, strategy formulation, or comprehensive decision-making processes, self-initiation, complete task management, and adaptation to complex scenarios.

The term "Kinematic data" in the context of the present disclosure refers to information describing the motion of objects, such as: position, orientation, linear velocity, angular velocity, linear acceleration, and angular acceleration. Kinematic data may be collected by any one or more suitable sensors, such as any combination of any one or more of the following: accelerometer, gyroscope, Inertial Measurement Unit (IMU), satellite navigation system (e.g., GPS), odometer, etc.

The term "self-navigable system" in the context of the present disclosure refers to an apparatus capable of autonomously determining and executing a travel path within a designated region, using integrated sensing technology, kinematic data, and computational algorithms. It is designed to independently maneuver through its operational environment, optionally detecting and avoiding impediments, and optionally altering its route as necessary. Such a system may optionally be capable of autonomy in additional aspects beyond navigation, such as any combination of one or more of the following: task initiation, strategy formulation, or comprehensive decision-making processes, self-initiation, complete task management, and adaptation to complex scenarios. Some systems with more advanced autonomy aspects may also be referred to as "self-piloting systems".

The same type of SLAM-based system can be used in very different types of regions (some examples are provided below, e.g., with respect to FIG. 1). Such SLAM-based systems used in different types of regions may be equipped with the same type of SLAM related components (e.g., the same models of any one or more of: processor, Central Processing Unit—CPU, Graphic Processing Unit—GPU, camera, Light Detection and Ranging—Lidar, Inertial Measurement Unit—IMU, odometer, and so on). As disclosed below in greater detail, the disclosed systems, methods, and computer program products may determine specific different values for operational parameters of the SLAM which optimize the performance of such SLAM-based system to a specific type of environment, and possibly even specific type of task to perform within that environment. For example, some of these parameters (discussed below in greater detail) may include, inter alia, any one or more of the following: Maximal number of features to track, Resolution downscale, Color scheme, Tracking frequency, Matching frequency, Frame comparison method, Fundamental confidence, Estimation iterations, Step size, Minimum features for loop closure detection, Loop closure weight value, Optimization frequency, IMU filter use, Detector+descriptor type, Inertial bias model, Image equalization usage, Feature depth in triangulation, Maximal RANSAC iterations, Minimal distance between features, and Minimal feature quality.

In accordance with an aspect of the presently disclosed subject matter, there is disclosed a computerized method for configuring navigation computer code for SLAM-based system, the method including:

a) Obtaining a three-dimensional (3D) model of a region of a first type of region (e.g., a warehouse, a mall, tunnel, a parking lot, outdoor area with roads).

b) Acquiring a first recording of visual data (VD) by at least one first VD collector traversing the region at first operational conditions and a second recording of VD by at least one second VD collector traversing the region at second operational conditions. For example, the different operational conditions may include for example: different times of day, different lighting conditions, different levels of atmospheric interference (e.g., different levels of fog, smog, or air turbulence), and so on. It is noted that the operational conditions may also pertain to the SLAM-based system itself (e.g., its available power level, its height of flight). It is noted that the first VD collector and the second VD collector can be either the same VD collector or different VD collectors (e.g., of the same model). While not necessarily so, a model of the first VD collector and/or of the second VD collector may be from an intended model for which the specific SLAM algorithm parameters are tailored, or otherwise generated VD adaptable to represent VD data collected by such intended model (e.g., by simulating intended model resolution, depth of field, etc.).

c) Applying SLAM to the first recording using a first plurality of sets of SLAM parameter values, generating using each of the sets of the first plurality of sets a corresponding first-recording trajectory assessing movement of the first VD collector within the region during the collection of the first VD recording. It is noted that the term "trajectory" in the context of the present disclosure pertains to data indicative of a series of locations in space, either with or without time data being associated with different locations of that series. Optionally, the trajectory may be further indicative of an orientation of an object participating in the recording process (e.g., a propagation direction of a SLAM-based system or of a VD collector, heading direction of a SLAM-based system or of a VD collector). That is, the trajectories generated in this step and in other steps of the method are not real-world trajectories which the respective VD collector actually navigated within the region during the respective recording, but rather an estimation of such a trajectory based on SLAM analysis of the respective recording using one of the sets of SLAM parameter values used in that specific SLAM analysis. Such an analysis may, of course, yield a trajectory (i.e., estimate) which diverges from an actual trajectory performed by the respective VD collector. The degree of this divergence may be used in the following steps of the methods for evaluating the suitability of the respective set of SLAM parameter values for SLAM in the respective type of region under the respective operational conditions.

It is noted that depending on the specific requirement of each implementation of the presently disclosed subject matter, a suitable number of sets of SLAM parameter values may be used for each of the VD recordings for which SLAM is applied (i.e., the first VD recording, the second VD recording, and any other optional VD recording which may be analyzed in a similar fashion). Such numbers (of sets of SLAM parameter values) may be determined in advanced, determined during runtime of the method (e.g., based on performance evaluation of different sets of SLAM parameter values, discussed below with respect to other steps of the method), or both. The number of trajectories created for each recording (based on different sets of SLAM parameter values) may include, for example, tens, hundreds, thousands, tens of thousands or hundreds of thousands of different trajectories, each resulting from applying a different set of SLAM parameter values to the respective recording. Such a systematic application of SLAM using different parameter value sets to one or more recording may include determining values for future sets of parameters (to be used for the same VD recording or to another analyzed VD recording) based on analysis of performance evaluations determined with respect to application of one or more previous sets of SLAM parameters, but this is not necessarily so. It is noted that optionally more than one type of SLAM algorithm may be attempted for the first recording and/or for any other recording (e.g., the second recording, etc.), e.g., in case some SLAM algorithms outperform other SLAM algorithms in different types of regions and/or in different operational conditions. In such case, the selection of the specific SLAM algorithm to attempt may be considered part of the set of SLAM parameters, for the sake of the methods disclosed herein.

d) Generating—for each set of SLAM parameter values out of the first plurality of sets—a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions. Each performance evaluation (generated in this step or in other method steps described below) may be indicative, for example, of a degree of divergence or error between the respective estimated trajectory and an actual trajectory of the respective VD collector (data of which may be included in the 3D model, in such an example). Each such performance evaluation may optionally be further indicative of performance parameters not related to accuracy of the trajectory estimation, such as power consumption of the SLAM computations using the respective set of parameters, CPU usage of the SLAM computations using the respective set of parameters, RAM usage of the SLAM computations using the respective set of parameters, and so on. Such performance evaluations may be useful, for example, for assessing a usability of SLAM algorithm that uses the respective set of parameters for performing within regions of the first type of region, especially under the respective operational conditions used in the respective recording of VD.

e) Applying SLAM to the second recording using a second plurality of sets of SLAM parameter values, generating using each of the sets of the second plurality of sets a corresponding second-recording trajectory assessing movement of the second VD collector within the region during the collection of the second VD recording. Some or all of the sets of SLAM parameters applied to the second VD recording may optionally also be used for analysis of the first VD recording (or any other analyzed VD recording, if any), but this is not necessarily so.

f) Generating—for each set of parameters out of the second plurality of sets—a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions. Optionally, the performances of one or more sets of SLAM parameter values may be evaluated for its performance with respect to two or more different operational conditions which existed in different recordings. The number of sets used for the generation of the second-recording trajectories may vary, e.g., as discussed above with respect to the first-recording trajectories. If more than two recordings are acquired, SLAM may be applied to each of such additional recordings using various sets of SLAM parameter values, and performance evaluations may be generated for each such set, respectively. While not necessarily so, any single set of SLAM parameter values may optionally be used for SLAM in different operational conditions (e.g., with respect to different recordings), to allow evaluation of the performance of SLAM using the respective set of parameters in different scenario in the region of the first type of region.

g) The method further includes determining an operational set of SLAM parameter values for a SLAM-based system based at least on the first plurality of performance evaluations and on the second plurality of performance evaluations (and optionally any other performance evaluation mentioned above). The operational set of SLAM parameters may be one of the tested sets of parameters (as discussed with respect to the method steps discussed above) or a set of SLAM parameters determined based on one or more of the aforementioned sets of parameters (e.g., averaging values of top five sets of parameters).

h) Following the determining, the method may continue with providing the operational set of SLAM parameter values to one or more SLAM-based systems equipped with VD processor, for navigating within the first type of region by executing SLAM computer readable code by the VD processor using the operational set of SLAM parameter values. For example, the set of SLAM parameters may be provided to a group of tens or hundreds of drones used within a warehouse of the first type of region. The method may be carried out for another type of region (e.g., mall), in which case a second operational set of parameters determined based on recordings of the other type of region may be provided to another plurality of similar SLAM-based systems equipped with similar VD processors (and possibly other similar component to the first group of SLAM-based systems, e.g., drones equipped similar cameras or LIDARs).

The disclosed systems, methods, and computer program products enable SLAM-based systems to navigate within one or more types of regions, as discussed in greater detail below. The term "navigation" in the context of the present disclosure when pertaining to the capabilities enabled for such SLAM-based systems may pertain to various capabilities all nested under the broader meaning of "navigating". Different SLAM-based systems provided with one or more operational sets of SLAM parameter values as taught in this disclosure may use these one or more operational sets for navigation by performing in the relevant region (or the relevant region type) a combination of one or more of the following actions using the respective one or more sets of parameters: mapping an area (e.g., mapping the region or part of the region which the respective system travers), localization, path planning, obstacle detection and avoidance, waypoint following, autonomous maneuvering, exploration, Manipulation of the environment (e.g., controllably moving obstacles in the region).

It should be noted that while the method was described above as a series of steps, the orders of the actions may change to suit any specific implementation, various steps may be executed concurrently or partly concurrently to one another, and so on. Also, execution of actions associated with any of the steps discussed above may optionally be based on outcomes of execution of other actions, associated with the same step or with other steps of the method. For example, sets of parameters may be selected based on the performance of other sets of parameters for the same or different VD recording, sets of parameters may be withdrawn from testing of some operational conditions if they performed poorly in other operational conditions, and so on.

Considering the aforementioned method as a whole, various sets of SLAM parameters are used to create trajectories based on various recordings of VD made in different operational conditions within the same type of region, and optionally within the same region itself (e.g., within a specific mall, above a specific parking lot). The performance of each such set of SLAM parameters is then evaluated for accuracy (based on the 3D model of the region in which the respective recording was made) and optionally for other performance parameters. Optionally, the performance of each out of a group of multiple sets of SLAM parameters may be evaluated in different operational conditions within the same type of region (e.g., in different times of the day above a parking lot, when a mall is opened or closed, etc.). Based on a plurality of such performance evaluations of different tested sets of SLAM parameters, the method continues with determining a single set of operational SLAM parameters, such as a set of SLAM parameters which performs sufficiently well in all of the tested operational conditions (e.g., in all tested illumination levels) in the specific selected type of region. As discussed above, different sets of operational parameters may be determined in the same way for different use cases (and specifically—for different types of regions) for the same or similar models of SLAM-based systems.

Finding a specific set of operational SLAM parameters which is best suited for a specific type of region may be beneficial in many cases. For example, attempting to use over-all optimized SLAM parameters for a SLAM-based system that is equipped with low-cost or low-quality components may not perform well, or simply not perform at all (e.g., the CPU power would not suffice, or many SLAM errors would result from low resolution data). The disclosed methods show a way to optimize performance of such SLAM-based systems for a specific use case (e.g., within a specific type of region), in the expense of reduced performance in other use cases (e.g., other types of regions). For example, drones which were programed with a set of SLAM parameters optimized for operating within a dimly lit warehouse according to the aforementioned method may perform poorly in a brightly lit mall, e.g., in comparison for a general set of SLAM parameters which was designed to operate in both types of regions (and possibly in others as well, like various outdoor use cases). However, the same drones would outperform the ones using the general set of SLAM parameters in the specific type of regions for which they were optimized—the dimly lit warehouse.

It is noted that while the method discussed above was described in the context of tailoring the operational set of SLAM parameter values for a specific type of region by testing it in different operational conditions in the same type of region, equivalent methods—mutatis mutandis—which are also included within the scope of the present disclosure may be used for tailoring the operational set of SLAM parameter values for a specific type of mission (performed in one type of region or alternatively in a plurality of types of regions) and/or for a subset of operational conditions (e.g., only for operating at low illumination levels, vs. only for operating at bright illumination levels). For example, when using a relatively cheaply equipped SLAM-based system of a similar kind (e.g., relatively cheaply equipped self-navigable systems such as robots, drones), warehouse management may use the aforementioned method for programing SLAM-based systems for one task (e.g., slow and low transfer of heavier objects in the warehouse) and another instance of the method for programing other similarly equipped SLAM-based systems of the same kind for another task (e.g., faster and higher path transfer of lighter objects in the warehouse). In another example, different instances of the methods may be used for determining two sets of SLAM operational parameters for a single SLAM-based system, for different uses. For example, such relatively cheaply equipped SLAM-based systems (e.g., robots, drones) may implement one set of SLAM operational parameters for a first type of task, a first type of region, and/or a first type of operational conditions, while using another set of SLAM operational parameters for a second type of task, a second type of region, and/or a second type of operational conditions, respectively. Such a SLAM-based system (e.g., a self-navigable system) may switch between such two or more sets of operational SLAM parameters based on predetermined programing (e.g., different times of day), based on task and/or type of region, based on external instructions, based on sensor data, based on its own assessment of SLAM performance, or in any other suitable way.

The term "VD collector" in the context of the present disclosure pertains to any entity which is capable of generating a recording of VD representing collection of VD along a trajectory moving within the region. Such a VD collector may include one or more actual sensors (e.g., Visible Light (VIS) Camera, Infrared (IR) Camera, Light Detection and Ranging (LiDAR), Thermal Imaging Camera, Time-of-Flight (ToF) Camera). Such a VD collector may include a simulated VD collector. For example, if a very high-quality 3D model of the region exists, a computer may be able to simulate recordings of video data by a simulated camera moving on a simulated drone within the 3D model.

The systems, methods, and computer program products disclosed in the present application may optionally be implemented in ways which are different than prior art optimization techniques. The systems, methods, and computer program products disclosed in the present application may optionally be used to optimize the navigation path of a system (e.g., UAV, robot, etc.) that have very limited resources (e.g., low-resolution cameras, cheap sensors, limited processing power) during real time operation, for a specific region of operation and under different environmental conditions.

According to an aspect of the presently disclosed subject matter there is disclosed a computerized method for configuring navigation computer code for a Simultaneous Localization and Mapping (SLAM) based system, the method including: (a) obtaining a 3D model of a region of a first type of region; (b) acquiring a first recording of visual data (VD) by at least one first VD collector traversing the region at first operational conditions and a second recording of VD by at least one second VD collector traversing the region at second operational conditions; (c) applying SLAM to the first recording using a first plurality of sets of SLAM parameter values, thereby generating using each of the sets of the first plurality of sets a corresponding first-recording trajectory assessing movement of the first VD collector within the region during the collection of the first VD recording; (d) for each set of SLAM parameter values out of the first plurality of sets, generating a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions; (e) applying SLAM to the second recording using a second plurality of sets of SLAM parameter values, thereby generating using each of the sets of the second plurality of sets a corresponding second-recording trajectory assessing movement of the second VD collector within the region during the collection of the second VD recording; (f) for each set of SLAM parameter values out of the second plurality of sets, generating a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions; (g) based at least on the first plurality of performance evaluations and on the second plurality of performance evaluations, determining an operational set of SLAM parameter values for a SLAM-based system; and (h) providing the operational set of SLAM parameter values to the SLAM-based system which is equipped with VD processor, for navigating within the first type of region by executing SLAM computer readable code by the VD processor using the operational set of SLAM parameter values.

According to a further aspect of the presently disclosed subject matter, a plurality of overlapping sets of SLAM parameter values is included in the first plurality of sets and in the second plurality of sets.

According to a further aspect of the presently disclosed subject matter, the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

According to a further aspect of the presently disclosed subject matter, the generating of the performance evaluations for each set out of a group of sets that includes at least one set out of the first plurality of sets and at least one another set out of the second plurality of sets includes: generating an accuracy evaluation and a resources consumption evaluation, wherein the determining includes balancing between accuracy and resource consumption by the operational set of SLAM parameter values.

According to a further aspect of the presently disclosed subject matter, the first recording and the second recording are based on recorded VD collected by a sensor group including at least one VD sensor being installed on a navigable platform when the navigable platform traverses the region; wherein the 3D model is generated based on VD collected by at least one high-quality VD sensor installed on the navigable platform concurrently to the collection of the recorded VD.

According to a further aspect of the presently disclosed subject matter, the first VD recording is generated by downgrading VD collected by the at least one high-quality VD sensor.

According to a further aspect of the presently disclosed subject matter, the sets of the first plurality of sets and the sets of the second plurality of sets each include different values of: (a) maximal number of features to track, (b) degree of resolution downscaling for feature extraction, and (c) pose-graph loop closing parameters.

According to a further aspect of the presently disclosed subject matter, the operational set of SLAM parameter values and a reference set of SLAM parameter values differ only in that the operational set of SLAM parameter values provides less of an identifiable resource for performance of SLAM, wherein execution of SLAM based on the operational set of SLAM parameter values by the SLAM-based system provides better SLAM accuracy with respect to the 3D model than execution of SLAM based on the reference set of SLAM parameter values.

According to a further aspect of the presently disclosed subject matter, the determining includes avoiding selection of sets of SLAM parameter values whose execution results in at least one of: (a) power consumption of the VD processor that exceeds a predetermined power consumption criteria, and (b) heating of the VD processor that exceeds a predetermined heating criteria.

According to an aspect of the presently disclosed subject matter, a computerized method for configuring at least one navigation computer code for operation of SLAM-based systems in different types of regions is disclosed, the method including: (a) executing the method of claim 1 for providing a first operational set of SLAM parameter values to a first SLAM-based system which is equipped with a first VD processor, for navigating within the first type of region by executing SLAM computer readable code by the first VD processor using the first operational set of SLAM parameter values; and (b) executing the method of claim 1 for a second type of region that is different than the first type of region, for providing a second operational set of SLAM parameter values to a second SLAM-based system which is equipped with a second VD processor, for navigating within the second type of region by executing SLAM computer readable code by the second VD processor using the second operational set of SLAM parameter values; wherein the first SLAM-based system and the second SLAM-based system are functionally equivalent, wherein the first VD processor and the second VD processor are functionally equivalent; wherein the first SLAM-based system outperforms the second SLAM-based system in regions of the first type of region, wherein the second SLAM-based system outperforms the first SLAM-based system in regions of the second type of region.

According to a further aspect of the presently disclosed subject matter, the second SLAM-based system is the first SLAM-based system that is operable to alternate between using the first operational set of SLAM parameter values when navigating the first type of region and using the second operational set of SLAM parameter values when navigating the second type of region.

According to a further aspect of the presently disclosed subject matter, the method further includes detecting deterioration in performance of SLAM using the first operational set of SLAM parameter values, and based on the detection triggering navigation using the second operational set of SLAM parameter values.

According to an aspect of the presently disclosed subject matter there is disclosed a computerized system for configuring navigation computer code for SLAM-based system, the system including: (a) a processor; and (b) non-tangible memory operable to store: (i) a three-dimensional (3D) model of a region of a first type of region; (ii) a plurality of first-recording trajectories, each first-recording trajectory including an assessment of movement of a first visual data (VD) collector through the region during collection of a first VD recording by the first VD collector, wherein each first-recording trajectory is generated from the first VD recording by application of SLAM using a different corresponding set of SLAM parameter values out of a first plurality of sets; (iii) a plurality of second-recording trajectories, each second-recording trajectory including an assessment of movement of a second VD collector through the region during collection of a second VD recording by the second VD collector, wherein each second-recording trajectory is generated from the second VD recording by application of SLAM using a different corresponding set of SLAM parameter values out of a second plurality of sets; and (iv) computer program code; wherein the non-tangible memory and the computer program code are configured, with the at least one processor, to cause the computerized system to at least: (i) for each set of SLAM parameter values out of the first plurality of sets, generate a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions; (ii) for each set of SLAM parameter values out of the second plurality of sets, generate a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions; (iii) based at least on the first plurality of performance evaluations and on the second plurality of performance evaluations, determine an operational set of SLAM parameter values for a SLAM-based system; and (iv) provide the operational set of SLAM parameter values to the SLAM-based system which is equipped with VD processor, for navigating within the first type of region by executing SLAM computer readable code by the VD processor using the operational set of SLAM parameter values.

According to a further aspect of the presently disclosed subject matter, a plurality of overlapping sets of SLAM parameter values is included in the first plurality of sets and in the second plurality of sets.

According to a further aspect of the presently disclosed subject matter, the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

According to a further aspect of the presently disclosed subject matter, the non-tangible memory and the computer program code are configured, with the at least one processor, to cause the computerized system to: (a) generate as part of the performance evaluations an accuracy evaluation and a resources consumption evaluation for each set out of a group of sets that includes (i) at least one set out of the first plurality of sets and (i) at least one another set out of the second plurality of sets, (b) in the determining of the operational set of SLAM parameter values, balance between accuracy and resource consumption by the operational set of SLAM parameter values.

According to a further aspect of the presently disclosed subject matter, the first recording and the second recording are based on recorded VD collected by a sensor group including at least one VD sensor being installed on a navigable platform when the navigable platform traverses the region; wherein the 3D model is generated based on VD collected by at least one high-quality VD sensor installed on the navigable platform concurrently to the collection of the recorded VD.

According to a further aspect of the presently disclosed subject matter, the first VD recording is generated by downgrading VD collected by the at least one high-quality VD sensor.

According to a further aspect of the presently disclosed subject matter, the sets of the first plurality of sets and the sets of the second plurality of sets each include different values of: (a) maximal number of features to track, (b) degree of resolution downscaling for feature extraction, and (c) pose-graph loop closing parameters.

According to a further aspect of the presently disclosed subject matter, the operational set of SLAM parameter values and a reference set of SLAM parameter values differ only in that the operational set of SLAM parameter values provides less of an identifiable resource for performance of SLAM, wherein execution of SLAM based on the operational set of SLAM parameter values by the SLAM-based system provides better SLAM accuracy with respect to the 3D model than execution of SLAM based on the reference set of SLAM parameter values.

According to a further aspect of the presently disclosed subject matter, the non-tangible memory and the computer program code are configured, with the at least one processor, to cause the computerized system to avoid determining an operational set of SLAM parameter values whose execution results in at least one of: (a) power consumption of the VD processor that exceeds a predetermined power consumption criteria, and (b) heating of the VD processor that exceeds a predetermined heating criteria.

According to a further aspect of the presently disclosed subject matter, the non-tangible memory and the computer program code are further configured, with the at least one processor, to determine a plurality of operational sets of SLAM parameter values based on corresponding 3D models and VD recordings and on performance analysis of different sets of SLAM based parameters, and to provide the plurality of operational sets to at least one SLAM-based system for navigation within region of different types of regions, wherein each of the operational sets of parameters is usable for optimizing performance of SLAM by SLAM-based system of a class of SLAM-based systems for a different type of region out of the different types of regions.

According to an aspect of the presently disclosed subject matter there is disclosed a non-transitory computer-readable medium for configuring navigation computer code for a Simultaneous Localization and Mapping (SLAM) based system that includes instructions stored thereon that when executed on a processor perform the steps of: (a) obtaining a 3D model of a region of a first type of region; (b) acquiring a first recording of visual data (VD) by at least one first VD collector traversing the region at first operational conditions and a second recording of VD by at least one second VD collector traversing the region at second operational conditions; (c) applying SLAM to the first recording using a first plurality of sets of SLAM parameter values, thereby generating using each of the sets of the first plurality of sets a corresponding first-recording trajectory assessing movement of the first VD collector within the region during the collection of the first VD recording; (d) for each set of SLAM parameter values out of the first plurality of sets, generating a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions; (e) applying SLAM to the second recording using a second plurality of sets of SLAM parameter values, thereby generating using each of the sets of the second plurality of sets a corresponding second-recording trajectory assessing movement of the second VD collector within the region during the collection of the second VD recording; (f) for each set of SLAM parameter values out of the second plurality of sets, generating a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions; (g) based at least on the first plurality of performance evaluations and on the second plurality of performance evaluations, determining an operational set of SLAM parameter values for a SLAM-based system; and (h) providing the operational set of SLAM parameter values to the SLAM-based system which is equipped with VD processor, for navigating within the first type of region by executing SLAM computer readable code by the VD processor using the operational set of SLAM parameter values.

According to a further aspect of the presently disclosed subject matter, a plurality of overlapping sets of SLAM parameter values is included in the first plurality of sets and in the second plurality of sets.

According to a further aspect of the presently disclosed subject matter, the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

According to a further aspect of the presently disclosed subject matter, the generating of the performance evaluations for each set out of a group of sets that includes at least one set out of the first plurality of sets and at least one another set out of the second plurality of sets includes: generating an accuracy evaluation and a resources consumption evaluation, wherein the determining includes balancing between accuracy and resource consumption by the operational set of SLAM parameter values.

According to a further aspect of the presently disclosed subject matter, the first recording and the second recording are based on recorded VD collected by a sensor group including at least one VD sensor being installed on a navigable platform when the navigable platform traverses the region; wherein the 3D model is generated based on VD collected by at least one high-quality VD sensor installed on the navigable platform concurrently to the collection of the recorded VD.

According to a further aspect of the presently disclosed subject matter, the first VD recording is generated by downgrading VD collected by the at least one high-quality VD sensor.

The non-transitory computer-readable medium according to any one of claims 23-28, wherein the sets of the first plurality of sets and the sets of the second plurality of sets each include different values of: (a) maximal number of features to track, (b) degree of resolution downscaling for feature extraction, and (c) pose-graph loop closing parameters.

According to a further aspect of the presently disclosed subject matter, the operational set of SLAM parameter values and a reference set of SLAM parameter values differ only in that the operational set of SLAM parameter values provides less of an identifiable resource for performance of SLAM, wherein execution of SLAM based on the operational set of SLAM parameter values by the SLAM-based system provides better SLAM accuracy with respect to the 3D model than execution of SLAM based on the reference set of SLAM parameter values.

According to a further aspect of the presently disclosed subject matter, the determining includes avoiding selection of sets of SLAM parameter values whose execution results in at least one of: (a) power consumption of the VD processor that exceeds a predetermined power consumption criteria, and (b) heating of the VD processor that exceeds a predetermined heating criteria.

According to an aspect of the presently disclosed subject matter there is disclosed a non-transitory computer-readable medium for configuring at least one navigation computer code for operation of SLAM-based systems in different types of regions, including instructions stored thereon, that when executed on a processor, perform the steps of: (a) executing operational instructions that include the instructions of any one of the previously suggested sets of instructions, for providing a first operational set of SLAM parameter values to a first SLAM-based system which is equipped with a first VD processor, for navigating within the first type of region by executing SLAM computer readable code by the first VD processor using the first operational set of SLAM parameter values; and executing the operational instructions for a second type of region that is different than the first type of region, for providing a second operational set of SLAM parameter values to a second SLAM-based system which is equipped with a second VD processor, for navigating within the second type of region by executing SLAM computer readable code by the second VD processor using the second operational set of SLAM parameter values; wherein the first SLAM-based system and the second SLAM-based system are functionally equivalent, wherein the first VD processor and the second VD processor are functionally equivalent; wherein the first SLAM-based system outperforms the second SLAM-based system in regions of the first type of region, wherein the second SLAM-based system outperforms the first SLAM-based system in regions of the second type of region.

According to a further aspect of the presently disclosed subject matter, the second SLAM-based system is the first SLAM-based system that is operable to alternate between using the first operational set of SLAM parameter values when navigating the first type of region and using the second operational set of SLAM parameter values when navigating the second type of region.

According to a further aspect of the presently disclosed subject matter, the non-transitory computer-readable medium further includes instructions for detecting deterioration in performance of SLAM using the first operational set of SLAM parameter values, and based on the detection triggering navigation using the second operational set of SLAM parameter values.

BRIEF DESCRIPTION OF THE DRAWINGS

In order to understand the presently disclosed subject matter and to see how it may be carried out in practice, embodiments will now be described, by way of non-limiting examples only, with reference to the accompanying drawings, in which:

FIG. 1 illustrates Diagrams 1A-1F as various types of SLAM-based systems in different types of regions;

FIG. 3 is a flow chart illustrating an example of a computerized method for configuring at least one body of navigation computer code for operation of one or more SLAM-based systems in different types of regions;

FIG. 4 illustrates configuring navigation computer code for one or more SLAM-based systems, shown as Diagrams 4A-4F, in accordance with examples of the presently disclosed subject matter;

Figure 2:
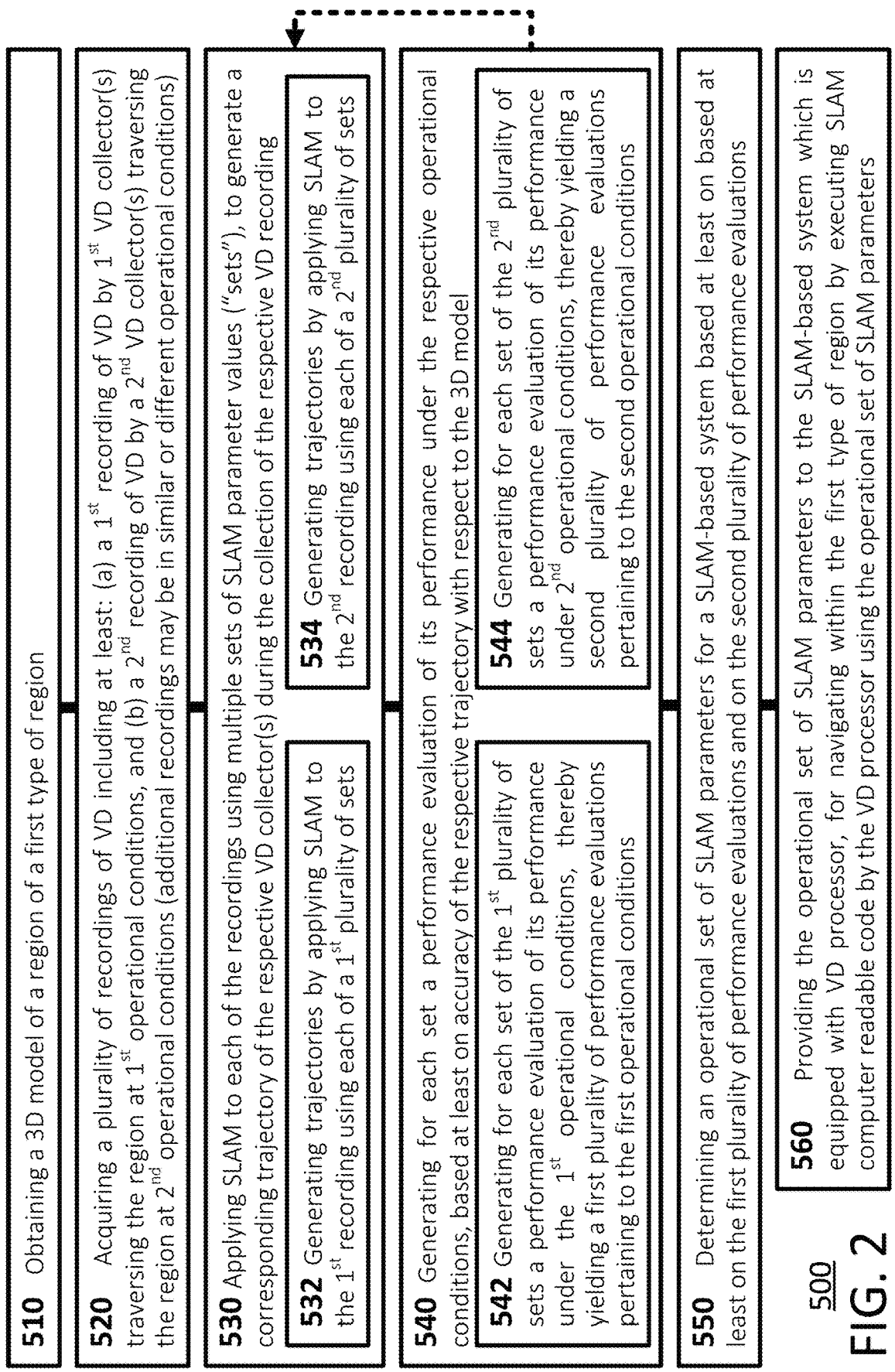
FIG. 2 is a flow chart illustrating an example of a computerized method for configuring navigation computer code for SLAM-based system.

It will be appreciated that for simplicity and clarity of illustration and description, certain elements in the figures may not have been drawn to scale. This could include the exaggeration of certain element dimensions relative to others. Additionally, corresponding or analogous elements may be identified using repeated reference numerals in the figures.

DETAILED DESCRIPTION OF EMBODIMENTS

In the following detailed description, numerous specific details are provided to ensure a comprehensive understanding of the presently disclosed subject matter. While these details aid in understanding, those skilled in the art will recognize that the presently disclosed subject matter can be implemented without these specific details. In addition, well-known methods, procedures, and components are not described in detail to avoid obscuring the presently disclosed subject matter. References to a method, system, or non-transitory computer readable medium should be interpreted inclusively, as including related aspects of the presently disclosed subject matter.

The functionality of the elements described herein may be implemented using circuitry or processing circuitry such as general-purpose processors, special purpose processors, integrated circuits, Application Specific Integrated Circuits (ASICs), and other conventional circuitries. Such circuitries and/or combinations thereof may be configured and/or programmed to perform the disclosed functionality. This also includes emerging technologies such as quantum processors and AI-driven systems. Processors, containing transistors and other components, are considered part of this circuitry. In this disclosure, the terms 'circuitry', 'units', or 'means' refer to hardware configured to perform the disclosed functions. Such processor may be implemented as purely hardware circuitry. In other possible implementations, processors, controllers, computers, units, or other means may be implemented using any combination of hardware with software and/or firmware.

The terms "computer", "processor", and "controller" should be expansively construed to cover any kind of electronic device with data processing capabilities, including, by way of non-limiting example, any combination one or more units of any of the following: a personal computer, a server, a computing system, a communication device, a processor (e.g. digital signal processor, DSP), a microcontroller, a field programmable gate array (FPGA), an application specific integrated circuit (ASIC), a smartphone, an electronic control unit (ECU) of a vehicle, cloud computing servers, an and so on. Unless stated otherwise, the terms "computer", "processor", and "controller" may also include a combination of several modules (e.g., several central processing units, CPUs), which operate together toward a goal. Unless specifically stated otherwise, as apparent from the following discussions, it is appreciated that throughout the specification discussions utilizing terms such as "processing", "calculating", "computing", "determining", "generating", "setting", "configuring", "selecting", "defining", or the like, include actions and/or processes of a computer that manipulate and/or transform data into other data. That data is represented as physical quantities, e.g., such as electronic or electromagnetic quantities, and/or said data representing physical objects.

It is appreciated that certain features of the presently disclosed subject matter, which are, for the sake of clarity of description, described in the context of separate embodiments, may also be combined in a single embodiment. Conversely, various features of the presently disclosed subject matter, which are, for brevity, described in the context of a single embodiment, may also be provided separately or in any suitable sub-combination. In embodiments of the presently disclosed subject matter one or more steps illustrated in the figures may be executed in a different order and/or one or more groups of steps may be executed simultaneously. The figures illustrate a general schematic of the system architecture in accordance with an embodiment of the presently disclosed subject matter. Each module in the figures can be made up of any combination of software, hardware and/or firmware that performs is the functions as defined and explained herein. The modules in the figures may be centralized in one location or dispersed over more than one location.

Any reference in the specification to a method should be applied mutatis mutandis to a system capable of executing the method. Any reference in the specification to a method which can be executed by a computer should be applied mutatis mutandis to a non-transitory computer readable medium that stores instructions that once executed by a computer result in the execution of the method. All the details, variations, optional features, optional steps which are discussed with respect to a system are also applicable, mutatis mutandis, to such a corresponding method (and non-transitory computer readable medium, where applicable), and vice versa.

FIG. 1 illustrates various types of SLAM-based systems 100 in three different environments or types of regions, in accordance with the presently disclosed subject matter. Each of the SLAM-based systems 100 exemplified in FIG. 1 may be implemented as a self-navigable SLAM-based system and/or as a non-self navigable SLAM-based system (e.g., controlled by a human operator and/or by an external machine). Diagram 1A illustrates two types of airborne drones in warehouse type of region. Such drones may be used, for example, for collecting items from different storage locations in different parts of the warehouse (e.g., in very low light). It is noted that any type of airborne drone may be implemented, such as fixed wing aircraft, helicopter, quadcopter, hybrid aircraft, VTOL aircraft, and so on. Diagram 1B illustrates the same two airborne drones in a shopping center type of region where they can be used, for example, to estimate crowding in different parts of the shopping center, verify whether emergency exit routes are clear, and so on. Diagram 1C illustrates the same two drones in the airspace of a parking lot type of region, where they can be used, for example, to identify empty parking spaces, illegally parked vehicles, and so on. Diagram 1D illustrates two type of ground navigable robots in the warehouse type of region. Diagram 1E illustrate these two types of ground navigable robots in a factory manufacturing floor type of region, and diagram 1F illustrate the same two types of ground navigable robots in the parking lot type of region.

As is demonstrated in these diagrams by way of example, the same type of SLAM-based system can be used in very different types of regions. Such SLAM-based systems used in different types of regions may be equipped with the same type of SLAM related components (e.g., the same models of any one or more of: processor, CPU, GPU, camera, Lidar, IMU, odometer, and so on). The disclosed systems, methods and computer program products may determine specific different values for operational parameters of the SLAM algorithm, which optimize the performance of such SLAM-based system (whether self-navigable system or not) to a specific type of environment, and possibly even specific type of task to perform within that environment.

For example, some of these parameters may include, inter alia:

a) Maximal number of features to track—this parameter determines a limit on a number of features tracked by the SLAM algorithm. A larger number of features increases CPU usage, and vice versa.

b) Resolution downscale—this parameter determines an extent of resolution decrease for feature extraction. A lower resolution decreases CPU usage, and vice versa.

c) Color scheme—this parameter determines the color scheme to be used (e.g., RGB vs grayscale). Some color schemes (e.g., grayscale) require less computational power than others (e.g., RGB) but may lead to loss of data, lower performances, etc.

d) Tracking frequency—this parameter determines a frequency in which the feature tracker is working. A lower frequency lowers the CPU usage, and vice versa.

e) Matching frequency—this parameter determines a frequency in which the feature matching is working. A lower frequency lowers the CPU usage at the possible expense of performance, and vice versa.

f) Frame comparison method—this parameter determines the method used for comparison between different frames (e.g., consecutive frames). For example, such comparison methods may include matching, tracking, and so on.

g) Fundamental confidence—this parameter determines a threshold of filtering out bad features. Fewer bad features results in more accurate results and less CPU usage, and vice versa.

h) Estimation iterations—this parameter determines a number of iterations for the optimizer to try solving the non-linear optimization problem. Less iterations requires less CPU usage, and vice versa.

i) Step size—this parameter determines a size of a sliding step for incremental smoothing of last stored data. Smaller step size requires less CPU usage, and vice versa.

j) Minimum features for loop closure detection—this parameter determines a minimal number of features needed for declaring of loop-closure found and for executing a loop correction. A smaller threshold may yield detection of more loops but possibly also to less accurate loops, while a higher amount may cause a decrease in the number of detected loops but also a better-quality loops which may also lead to less CPU usage.

k) Loop closure weight value—this parameter determines a weight given to the loop correction in relation to the sequential odometry graph. Less weight may lead to smaller loop corrections but may remove outlier loops, and vice versa.

l) Optimization frequency—this parameter determines a frequency of loop closure detection attempts. A lower frequency will lead to less loops but also less CPU usage, and vice versa. The suitable value for this parameter in different use cases highly depends on the speed and environment of the SLAM-based system, and on how many visual markers are available during operation for loop detection.

m) IMU filter use—this parameter determines whether to use a filter on the IMU data or not, and possibly also which filter to use. Using a filter may improve results but at an added cost of CPU usage, and vice versa.

n) Detector+descriptor type—this parameter determines which kind of feature detector and descriptor to use. Different detectors and descriptors have different benefits in different environments, and different use cases benefit from different combinations of detector and descriptor type.

o) Inertial bias model—this parameter determines which IMU model to use (e.g., from a predetermined list), such as constant, gaussian, uniform.

p) Image equalization usage—this parameter indicate whether and/or how image equalization should be used, balancing between CPU usage and CPU power requirements to image quality in some cases.

q) Feature depth in triangulation—this parameter (and/or "limited feature depth in triangulation") pertains to removal of outliers, which may benefit the SLAM process in some cases but might fail in others.

r) Maximal Random sample consensus (RANSAC) iterations—this parameter pertains to removal of outliers, with higher iteration number requires more CPU power but may yield better results. Other ways of removing outliers may also be optionally implemented.

s) Minimal distance between features—this parameter pertains to the distance between features used in the SLAM process, and control of this parameter may balance CPU usage and accuracy.

t) Minimal feature quality—this parameter may be used to control stability and to removes outliers, but might remove too many outliers if applied too strictly.

As mentioned above, different SLAM algorithms may optionally be implemented by a single SLAM-based system (whether a self-navigable system or not), and in such case performances of such different SLAM algorithms may be tested in one or more operational conditions, by applying them to one or more of VD recordings. In such case, selection of which SLAM algorithm to use may also be included in the set of SLAM parameter values tested, along with other SLAM parameter values needed for the operation of that SLAM algorithm.

It should be noted that finding an optimized combination of SLAM parameter values (optimized for a type of region and to a group of operational conditions) is not a straightforward task, and that any suitable technique may be used in order to: (a) conjure relevant sets of SLAM parameter values, (b) to test them, and/or to (c) select and/or define new sets of parameters based on the performance evaluations of previously tested sets of SLAM parameter values. Some such techniques which may be used in the systems, methods, and computer program product herein disclosed include: Bayesian optimization, machine learning-based approaches (e.g., unsupervised learning, supervised learning), heuristic methods (e.g., tabu search, ant colony optimization, harmony search), evolutionary algorithms (e.g., genetic algorithms, particle swarm optimization), and so on.

The systems, methods, and computer program products describe below demonstrate, inter alia, techniques for tailoring specific SLAM parameters in order to optimize usage of a given combination of SLAM-related components installed on a SLAM-based system (e.g., processor, camera, IMU), in order to optimize the performance of the specific SLAM-based system's SLAM in a specific type of region.

It is noted that the presently disclosed subject matter may be implemented for any type of SLAM-based system and is not restricted to airborne drones or to SLAM-based ground robots. Some examples of SLAM-based systems which may implement the SLAM-based techniques disclosed in the present disclosure include for example the following systems or system mounted on such systems: agricultural equipment and systems (e.g., tractors, combine harvesters), warehouse robots and systems (e.g., forklifts, inventory tracking drones), Automated Guided Vehicles (AGVs) in manufacturing (e.g., materials handling robots, assembly line feeders), household robots and systems (e.g., robot vacuum, motorized lawn mowers), marine vessels (e.g., manned or unmanned surface vehicles, underwater vehicles), healthcare devices (e.g., mobile medication dispensing robots, autonomous patient monitoring systems), urban mobility systems (e.g., public transport vehicles, self-docking scooters). In any of the examples above (and pertaining to other implementations as well), the SLAM-based system and/or the system carrying it may be autonomous, partly autonomous, or nonautonomous. In any of the examples above (and pertaining to other implementations as well), the SLAM-based system and/or the system carrying it may be manned, unmanned, passenger carrying, or occasionally manned.

FIG. 2 is a flow chart illustrating an example of method 500, in accordance with the presently disclosed subject matter. Method 500 is a computerized method for configuring navigation computer code for SLAM-based system. Referring to the examples set forth with respect to the other drawings, method 500 may optionally be executed by system 200 and/or by processor 220. For example, method 500 may be implemented as a computerized method for configuring navigation computer code for a vision-based SLAM-based system. The term "vision-based" in the context of the present application pertain to being based on optical data, such as images, videos, depth model generated using electrooptical systems (e.g., LIDAR, time-of-flight camera, structured light sensor, stereoscopic camera, photogrammetry sensor, multispectral and hyperspectral imaging sensor, infrared sensor, laser scanners), and not only to vision in the sense of image or video.

Step 510 of method 500 includes obtaining a three-dimensional (3D) model of a region of a first type of region. The obtaining of the 3D module may be carried out in any suitable way, such as receiving a 3D model from an external source, generating a 3D model VD collected by a system moving within the region (whether autonomously moving or not, whether autonomously navigating or not; it could be similar to a vision-based self-navigable system for which the navigation computer code is configured, if applicable, or it can be any other platform), by a human-controlled system traversing the region, by processing 2D data or partial 3D data of the region, and so on. Furthermore, any suitable type (or types) of 3D models may be used, such as:
  a) Point Cloud Model: this model consists of a large number of points in a 3D coordinate system. Each point represents a surface element of the scanned object or area.
  b) Polygonal Mesh Model: this model is made up of vertices, edges, and faces that define the shape of a polyhedral object in 3D space.
  c) Volumetric Model (Voxel-based Model): this represents a 3D space by dividing it into a grid of cubes (voxels). Each voxel contains data about the environment, such as color and material properties.
  d) Surface Reconstruction Model: created from point clouds or other forms of raw 3D data. Algorithms are used to construct continuous surfaces that approximates the data points.
  e) Wireframe Model: a basic form of 3D modeling, which consists only of points and lines connecting those points.

Whichever one or more types of model are used for the 3D model, the 3D model of the region may be a high-quality model, which allow to reliably and effectively assess accuracy of SLAM based trajectories, to allow for meaningful differentiation of the usability of various sets of SLAM parameter values. For example, a spatial resolution of the 3D model may be better than 50 mm. It should be noted that step 510 is not necessarily the first step of the method, and it may be executed before, after, and/or partly or fully concurrently to other steps of method 500, as long as it is available for the evaluation of performance of the different sets of SLAM parameter values. It is also noted that optionally, more than one 3D model of one or more regions of the first type of region (e.g., various warehouses), in which case the VD recordings of the steps discussed below may pertain to either one of the 3D models of the region(s) of the first type. For example, a first 3D model of a first region of the first type may be used to assess one or more VD recordings in one or more operational conditions, and a second 3D model of a second region of the first type may be used to assess one or more VD recordings in one or more operational conditions (each operational condition either similar to ones used with respect to the first 3D model or not). Referring to the examples set forth with respect to the other drawings, step 510 may optionally be executed by system 200, e.g., by processor 220 and/or by memory module 250, optionally with the assistance of optional communication module 240.

It should be noted that a "type of region" may pertain to varied conditions within a certain region (e.g., a certain geographic and/or a certain contextual region). For example, a type of region may pertain not only to the geography, facilities, etc. in the region (e.g., a mall, a parking lot, outdoor area with road, a forest, a factory, a swimming pool, ocean floor, a tunnel), but also for a condition residing in such a region (e.g., season, illumination, wind velocity, etc.). For example, it is possible to determine a first set of operational SLAM parameters (e.g., in step 550) for a first type of region which is "parking lot in summer" and to determine a second set of operational SLAM parameters for a second type of region which is "parking lot in winter". For example, it is possible to determine a first set of operational SLAM parameters to a first type of region which is "'Harmony Plaza' mall during working hours" and to determine a second set of operational SLAM parameters to a second type of region which is "'Harmony Plaza' mall outside working hours". For example, it is possible to determine a first set of operational SLAM parameters to a first type of region which is "beach strip without wind" and to determine a second set of operational SLAM parameters to a second type of region which is "beach strip with significant wind". Furthermore, in some cases it is possible to implement the presently disclosed subject matter, mutatis mutandis, such that a type of region further pertains to a condition of the SLAM-based system itself. For example, it is possible to determine a first set of operational SLAM parameters to a first type of region which is "factory production floor when the camera of the SLAM-based system operates at a first field-of-view setting" and to determine a second set of operational SLAM parameters to a second type of region which is "factory production floor when the camera of the SLAM-based system operates at a second field-of-view setting". The type of region may also pertain to the navigational regime of the SLAM-based system, such as height above ground of VD sensor, typical angle of view of VD sensor, velocity, etc.

Step 520 of method 500 includes acquiring (a) a first recording of visual data (VD) by at least one first VD collector traversing the region at first operational conditions and (b) a second recording of VD by at least one second VD collector traversing the region at second operational conditions. Depending on the implementation, the second VD collector may be the same VD collector as the first VD collector, a VD collector of the same type as the first VD collector, or a VD collector of a different kind. Each of the first VD collector and the second VD collector may include, for example, any one or more of the following: one or more sensors, one or more processors, one or more IMU, and so on. Alternatively (or additionally), each of the first VD collector and the second VD collector may optionally be a virtual or simulated VD collector, wherein the respective recording of VD data may in such case simulate movement of the VD collector (e.g., which may resemble an actual camera or another sensor with known capabilities) via a simulated version of the region (e.g., the 3D model). Referring to the examples set forth with respect to the other drawings, step 520 may optionally be executed by system 200, e.g., by processor 220 and/or by memory module 250, optionally with the assistance of optional communication module 240. Referring to the examples set forth with respect to the other drawings, the VD recordings of step 520 may optionally be recorded by a camera, LIDAR, or another sensor. Step 520 may also include acquiring additional VD recordings by respective VD collectors (the same or others) in the regions or in other regions of the same first type of region, in the same or in different operational conditions. If more than two recordings of VD are acquired, the steps of method 500 discussed below may be expanded to include such recordings, mutatis mutandis. The order in which steps 510 and 520 are executed may vary, depending on implementation and on circumstances (e.g., before, after, concurrently, partly concurrently, during).

In some implementations, multiple recordings may be obtained for each of the operational conditions of step 520 (e.g., the first operation conditions, the second operational conditions). In some implementations, multiple recording in each of these different operational conditions may be required for the successful execution of any combination of one or more of the other steps of method 500. For example, step 520 may include acquiring (a) at least $N_{VDR}$ first recordings of VD by one or more first VD collectors traversing the region at the first operational conditions and (b) at least $N_{VDR}$ second recording of VD by one or more second VD collectors traversing the region at the second operational conditions (and possibly also at least $N_{VDR}$ recording of VD by at least one respective VD collector traversing the region any additional set of operational conditions used in the system). For example, $N_{VDR}$ may be between 3-5, between 5-10, between 10-20, and so on. The same or different VD collectors may be used for different recordings in each of the aforementioned examples.

In some implementations, the one or more VD recordings obtained in step 520 for each of the operational conditions (e.g., the first operation conditions, the second operational conditions) may be of a minimal combined durations for each of these operational conditions. For example, step 520 may include acquiring (a) one or more first recordings of VD by one or more first VD collectors traversing the region at the first operational conditions, having a combined duration of at least $T_{VDR}$, and (b) one or more second recordings of VD by one or more second VD collectors traversing the region at the second operational conditions, also having a combined duration of at least $T_{VDR}$ (and possibly also one or more VD recordings by at least one respective VD collector traversing the region having a combined duration of at least $T_{VDR}$ for any additional set of operational conditions used in the system). For example, $T_{VDR}$ may be one of the following values: 5 minutes, 15 minutes, 30 minutes, 1 hour, 5 hours, 10 hours, 24 hours, or longer. The same or different VD collectors may be used for different recordings in each of the aforementioned examples.

In some implementations, the one or more VD recordings obtained in step 520 for each of the operational conditions (e.g., the first operation conditions, the second operational conditions) may cover a minimal combined area to be mapped, for each of these operational conditions. For example, step 520 may include acquiring (a) one or more first recordings of VD by one or more first VD collectors traversing the region at the first operational conditions, imaging a combined area of at least $A_{VDR}$, and (b) one or more second recordings of VD by one or more second VD collectors traversing the region at the second operational conditions, also imaging a combined area of at least $A_{VDR}$ (and possibly also one or more VD recordings by at least one respective VD collector traversing the region having a combined covered area of at least $A_{VDR}$ for any additional set of operational conditions used in the system). For example, $A_{VDR}$ may be one of the following values: 100 m$^2$, 1,000 m$^2$, 10,000 m$^2$, 100,000 m$^2$, 1,000,000 m$^2$, or larger. The same or different VD collectors may be used for different recordings in each of the aforementioned examples. $A_{VDR}$ may also be defined relative to an average instantaneous visible surface area (e.g., floor area), denoted $A_{AVG}$, which is an average of the surface area visible to the at least one respective VD collector of a respective VD recording during that recording. For example, $A_{VDR}$ may be one of the following values: 10·$A_{AVG}$, 10·$A_{AVG}$, 1,000·$A_{AVG}$, 10,000·$A_{AVG}$, 100,000·$A_{AVG}$, or larger. The same or different VD collectors may be used for different recordings in each of the aforementioned examples.

It is noted that while the first recordings and the second recordings are discussed for convenience as distinct recordings, it is possible to use some parts of a single continuous VD recording in which the region (and/or the SLAM-based system) is under the first operational condition as one or more "first recordings", and to use other parts of the same single continuous VD recording in which the region (and/or the SLAM-based system) is under the second operational condition as one or more "second recordings"). For example, if during a VD recording flight of drone the external temperature changes drastically, different parts of the same VD recording may be attributed to different operational conditions.

Referring to step 520 as a whole, it is noted that different implementations of the presently disclosed subject matter may implement varying degrees of variation among the operational conditions in relation to each other (e.g., the first operational conditions, the second operational conditions, and so on). For example, the difference in illumination levels between the first operational conditions and the second operational conditions may be by a ratio of at least ×10, at least ×100, at least ×500, etc. (e.g., 10-100 Lux vs 10-25 klx). For example, the difference in illumination angle (e.g., sun angle) between the first operational conditions and the second operational conditions may be of at least 10°, at least 25°, at least 50°, etc. (e.g., sun angles of 10-150 vs 75-90° above the horizon). For example, the difference in available CPU power between the first operational conditions and the second operational conditions may be of at least ×2, at least ×5, at least ×20, etc. (e.g., 1 GFLOPS vs 15 GFLOPS). For example, the difference in clock speed in which a processor of the SLAM operates between the first operational conditions and the second operational conditions may be of at least ×2, at least ×5, at least ×20, etc. (e.g., 1 GHz vs 22 GHz). The difference between the operational conditions may also be defined based on how well a given SLAM algorithm perform in both conditions. For example, a SLAM algorithm which works well in regions of the first type of regions under both the first operational conditions and the second operational conditions, may nevertheless perform better by a measurable ratio (or difference) under the first operational conditions compared to its operation under the second operational conditions. For example, such a ratio may be at least 10%, at least 20%, at least 50%, at least 100%. Such a ratio may be applicable, for example, to any one or more of the following parameters: performance evaluation (determined in step 540), accuracy, robustness, real-time performance (e.g., lag time for map creation), resource efficiency (e.g., CPU, GPU, memory), feature detection and tracking, loop closure detection, and so on.

Referring to step 520 as a whole, it is noted that optionally the first at least one recording and the at least one second recording may be based on recorded VD collected by a sensor group that includes at least one VD sensor being installed on a navigable platform when the navigable platform traverses the region (in one or more instances). Referring to the examples set forth with respect to the other drawings, the platform may be platform 100 and the group of sensors may include sensors such as camera, LIDAR, etc. Optionally, the 3D model may be generated based on VD collected by at least one high-quality VD sensor installed on the same navigable platform used for recording the first VD recording and/or the second VD recording, optionally concurrently with the collection of the recorded VD. The high-quality VD data may be collected by the same sensor as the first VD recording and/or second VD recording (e.g., the same high-quality camera), or by another sensor. For example, the 3D model may be based on data from high-quality camera and/or high-quality LIDAR, in combination with high quality IMU, while the VD recordings used for testing the different sets of parameters may be used by lower quality equipment (e.g., camera, LIDAR, IMU) which is similar (or identical) to the equipment which will ultimately be used by the SLAM-based system for which the operational set of SLAM parameter values (determined in step 550) is intended. Alternatively (or in combination), the at least one first VD recording and/or the at least one second VD recording (as well as additional recordings suitable for other types of regions, if any) may be generated by downgrading the VD collected by the at least one high-quality VD sensor. For example, during a stage of collecting data for method 500, a system equipped with a single camera (a high-quality camera) may collect video of the area which is used both for the generation of the 3D model (e.g., using high-requirement SLAM algorithm) and for generation of lower-quality recordings emulating lower-quality equipment, for testing different sets of SLAM parameter values (e.g., in steps 530 and 540).

It should be noted that optionally, visual data recordings may be acquired (and processed with respect to the steps of method 500 discussed below) for a plurality of regions belonging to the same type regions. For example, visual data recordings may be taken in two or three warehouses for the region type "warehouse". In such case, the term "region" may be construed to pertain to several specific regions which are not geographically bordering one another. In such case, the term "3D model" may also be construed to pertain to a model of such several specific regions, whether or not such 3D models are stored together or not (e.g., in a single file or not, on a single system or not, etc.). In other cases, however, the region to which method 500 pertains is a single continuous area (or volume), and the 3D model represents some or all of that region (albeit optionally stored as one uniform model or as several 3D models, e.g., for reasons of memory size, computation speed, etc.).

Step 530 of method 500 includes applying SLAM to each of the recordings acquired in step 520. For each recordings, SLAM is applied to the respective VD recording in different instances using different sets of SLAM parameter values (also referred to as "sets"), to generate a corresponding trajectory of the respective VD collector(s) during the collection of the respective VD recording.

Step 530 includes at least steps 532 and 534. Step 532 includes applying SLAM to the first recording using a first plurality of sets of SLAM parameter values, generating using each of the sets of the first plurality of sets a corresponding first-recording trajectory assessing movement of the first VD collector within the region during the collection of the first VD recording. Step 534 includes applying SLAM to the second recording using a second plurality of sets of SLAM parameter values, generating using each of the sets of the second plurality of sets a corresponding second-recording trajectory assessing movement of the second VD collector within the region during the collection of the second VD recording. Thus, step 530 yields at least: a first plurality of first-recording trajectories, each being generated by applying a different set of SLAM parameter values to the first recording, and a second plurality of second-recording trajectories, each being generated by applying a different set of SLAM parameter values to the second recording. The first plurality of first-recording trajectories pertain to the first operational conditions, and the second plurality of second-recording trajectories pertain to the second operational conditions. One or more sets of SLAM parameter values (potentially all of them) may be used for generating trajectories from both the first recording and the second recording, but this is not necessarily so.

Optionally, the applying of the SLAM to the different recordings in step 530 may be implemented by any combination of one or more of the following:
a) One or more components of the SLAM-based system (or of the class of SLAM-based systems) for which the operational set of SLAM parameter values is intended (e.g., processor, VD processor, memory module, etc.);
b) One of more components similar of equivalent to these of the SLAM-based system (or of the class of SLAM-based systems) for which the operational set of SLAM parameter values is intended (e.g., components of the same model, or of equivalent performance parameters);
c) Higher performance components (e.g., stronger and/or faster processor, larger memory module) which is configured to emulate and/or simulate one or more of the components of the SLAM-based system (or of the class of SLAM-based systems) for which the operational set of SLAM parameter values is intended;
d) Any other processor, memory module, etc.

Referring to the examples set forth with respect to the other drawings, step 530 may optionally be executed by processor 220, e.g., by optional SLAM-enabled trajectory generation module 226.

It is noted that any suitable technique for determining the multiple sets of SLAM parameter values may be implemented, many such techniques are known in the art. The determining of the sets of SLAM parameter values may optional depend (at least partly) on execution of SLAM using other sets of SLAM parameter values in step 530, e.g., depending on the performance evaluations generated for the respective sets in step 540 (such feedback is represented by the dashed arrow in FIG. 2). A few nonlimiting examples for techniques which may be used (possibly in combination with other techniques) for generating the sets of SLAM parameter values tested in step 530 include: Bayesian optimization, machine learning-based approaches (e.g., unsupervised learning, supervised learning), heuristic methods (e.g., tabu search, ant colony optimization, harmony search), evolutionary algorithms (e.g., genetic algorithms, particle swarm optimization), and so on.

While not necessarily so, one or more sets of SLAM parameter values may be used (in step 530) and tested (in step 540) with respect to different operational conditions (i.e., both in step 532 and in step 534, and possibly in other operational conditions as well, if applicable). Additionally or alternatively, subtle variations of one or more sets of SLAM parameter values may be used (in step 530) and tested (in step 540) with respect to different operational conditions (i.e., both in step 532 and in step 534, and possibly in other operational conditions as well, if applicable). Additionally or alternatively, one or more sets of SLAM parameter values may be used (in step 530) and tested (in step 540) with respect to one or more operational conditions (e.g., in step 532 and possibly in other operational conditions as well, if applicable) but not with respect to one or more other operational conditions (e.g., not step 534). The decision whether to try a single set of SLAM parameter values only for recordings collected under one of the operational conditions or for recordings collected under a plurality of operational conditions (possibly with some slight modifications to the values of the set) may depend on various considerations such as performance of this set for one of the operational conditions (e.g., it may be useless to check a set which already failed for another recording), computation efficiency, power consumption, and so on. Optionally, a plurality of overlapping sets of SLAM parameter values is comprised in the first plurality of sets and in the second plurality of sets.

Depending on the SLAM algorithm implemented, values of different SLAM parameters may be tested in steps 530 and 540. It is noted that method 500 does not necessarily involve trying different values for each parameter used by for SLAM by the SLAM-based system, and that optionally the values of one or more (or even most) of the parameters may remain constant across method 500. In different implementations of method 500, different combinations of parameters may be subject to modification and testing as discussed with respect to method 500. For example, some or all of the first plurality of sets and/or some or all of the second plurality of sets may each include different values at least for one (or more) of the following exemplary combinations of parameters:
  a) Maximal number of features to track, degree of resolution downscaling for feature extraction, and posegraph loop closing parameters.
  b) Maximal number of features to track, tracking frequency, and Detector+descriptor type.
  c) Minimal distance between features, Loop closure weight value, and Feature depth in triangulation.
  d) Degree of resolution downscaling for feature extraction, Frame comparison method, and IMU filter use.
  e) Color scheme, Tracking frequency, and Matching frequency.
  f) Frame comparison method, Fundamental confidence, and Estimation iterations.
  g) Minimum features for loop closure detection, Loop closure weight value, and Optimization frequency.
  h) IMU filter use, Detector+descriptor type, and Inertial bias model.
  i) Image equalization usage, and Maximal RANSAC iterations.
  j) Minimal distance between features, and Minimal feature quality.

Step 540 of method 500 includes generating for each set of SLAM parameter values a performance evaluation of its performance under the respective operational conditions, based at least on accuracy of the respective first-recording trajectory with respect to the 3D model. Step 540 includes at least steps 542 and 544. Step 542 includes generating, for each set of SLAM parameter values out of the first plurality of sets, a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions. Step 544 includes generating, for each set of SLAM parameter values out of the second plurality of sets, a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions. Referring to the examples set forth with respect to the other drawings, step 540 may optionally be executed by processor, e.g., by the optional SLAM-performance evaluation module 222.

Each performance evaluation generated in step 540 may optionally be indicative, for example, of a degree of divergence or error between the respective estimated trajectory and an actual trajectory of the respective VD collector (data of which may be included in the 3D model, in such an example). That degree of divergence or error may be measured in any suitable technique, many of which are known in the art, such as Root Mean Squared Error (RMSE), Mean Absolute Error (MAE), absolute trajectory error (ATE).

Each such performance evaluation may optionally be further indicative of performance parameters not related to accuracy of the trajectory estimation, with respect to the relevant operational conditions and/or use case. Such performance parameters may include, for example, any combination of one or more of the following: power consumption of the SLAM computations using the respective set of parameters, CPU usage of the SLAM computations using the respective set of parameters, RAM usage of the SLAM computations using the respective set of parameters, temperature change resulting from SLAM computations using the respective set of parameters, stability and repetitiveness of the system and so on. Such performance evaluations may be useful, for example, for assessing a usability of SLAM algorithm that uses the respective set of parameters for performing within regions of the respective type of region, especially under the respective operational conditions used in the respective recording of VD.

Step 550 of method 500 includes determining an operational set of SLAM parameter values for a SLAM-based system. The determining of step 500 may be based on various factors, including at least the first plurality of performance evaluations and on the second plurality of performance evaluations. If performance evaluations are generated for additional sets of operational conditions, the determining of step 550 may be further based on such additional performance evaluations. The determining of step 550 may be based on performance evaluations of various factors, including at least an evaluation of accuracy with respect to the 3D model of the respective trajectories (including at least trajectories corresponding to the first sets of SLAM parameter values and to the second sets of SLAM parameter values). Referring to the examples set forth with respect to the other drawings, step 550 may optionally be executed by processor 220, e.g. by the optional SLAM configuration module 224.

The determining of step 550 may include selecting one of the tested sets of parameters (e.g., in steps 530 and 540, either for the first operational conditions, for the second operational conditions, or both) as the operational set of SLAM parameter values, but this is not necessarily so. The determining of step 550 may include determining a novel set of SLAM parameter values that have not been tested (e.g., in steps 530 and 540, either for the first operational conditions, for the second operational conditions, for both, or optionally for other tested operational conditions). This determining of a novel set of SLAM parameter values may be based on any one or more of the aforementioned sets of parameters, and may be implemented in any suitable technique. For example, SLAM parameter values for the operational set of SLAM parameter values may be obtained by averaging tested values of these parameters based on the associated performance evaluations, may be obtained by modifying specific tested parameter values according to predetermine rules, may be determined based on the performance evaluations using machine learning (ML) algorithms, or in any other suitable way.

The determining of step 550 may include determining all of the parameter values required for operation of the SLAM algorithm, or any subgroup and/or combination of multiple parameter values required for operation of the SLAM algorithm. For example, some of the parameter values may be predetermined or dictated by requirements of the SLAM-based system for which the algorithm is intended, while other parameters may be tailored by implementing method 500. In several of the possible implementations of method 500, the determining of step 550 may include determining parameter values for any combination of one or more of the following aforementioned parameters (and possibly additional parameter values): Maximal number of features to track, Resolution downscale, Color scheme, Tracking frequency, Matching frequency, Frame comparison method, Fundamental confidence, Estimation iterations, Step size, Minimum features for loop closure detection, Loop closure weight value, Optimization frequency, IMU filter use, Detector+descriptor type, Inertial bias model, Image equalization usage, Feature depth in triangulation, Maximal RANSAC iterations, Minimal distance between features, and Minimal feature quality. In several of the possible implementations of method 500, the determining of step 550 may include determining parameter values for parameters relating to any combination of one or more of the following (and possibly additional parameter values): tracked features, image resolution, 3D model resolution, rate, frequency, or number of iteration of any one or more SLAM computations and/or functions, threshold parameters, bad features, data smoothing, data cleansing, SLAM loop closure detection, SLAM pose graph, IMU data, navigational data, component operational parameters (e.g., of camera, LIDAR, IMU, processor), SLAM description.

Referring to step 550 as a whole, it is noted that while the determined SLAM parameter values are useful (e.g., optimized) for the first type of region, they may not operate as well for other types of region. For example, there may be one or more other sets of SLAM parameter values (also referred to as "different set of SLAM parameter values") such that the operational set of SLAM parameter values outperforms this different operational set of SLAM parameter values in regions of the first type of region, while that same other operational set of SLAM parameter values outperforms the operational set of SLAM parameter values in regions of a second type of regions (or would outperform if implemented, which is not necessarily implemented). Any of the types of regions given as examples above is also applicable as a nonlimiting example for the first and the second types of regions of this paragraph. For example, both the first type of region and the second type of region may be different types of regions selected from a group of types of regions consisting of: indoor warehouse, indoor mall, outdoor area with roads.

The determining of step 550 may include balancing between performance parameters (e.g., balancing between accuracy of the resulting SLAM algorithm and other performance parameters for it such as computational power requirement, energetic efficiency, and so forth). For example, the generating of the performance evaluations determining an operational set of SLAM parameter values which provide less accurate result than another set of SLAM parameter values for this type of region (e.g., 5% less accurate), because the computational requirements are significantly lower (e.g., by 20%). For example, step 550 may include selecting between (a) a first set of operational SLAM parameters which provide higher accuracy at higher resource consumption in the first type of region and (b) a second set of operational SLAM parameters which provide lower accuracy at lower resource consumption in the first type of region. The balancing between the different considerations may depend on various factors, such as cost, limitations, intended use, characteristics of the type of region, characteristics of the task to be performed in the region, susceptibility to errors, and so on. Optionally, for each set out of a group of sets that includes at least one set out of the first plurality of sets and at least one another set out of the second plurality of sets, method 500 may include:

a) In step 540, generating an accuracy evaluation and a resources consumption evaluation (e.g., battery consumption and/or CPU power) for at least one of the operational conditions;

b) In step 550 balancing between accuracy and resource consumption by the operational set of SLAM parameter values It is noted that some sets of SLAM parameter values may provide high accuracy while nevertheless requiring computational power which is either unavailable or too costly, causing a temperature of the CPU or other units of the SLAM-based system to exceed a temperature threshold, draining a battery too quickly, etc. Step 550 may optionally include avoiding selection of sets of SLAM parameter values whose execution results in power consumption of the VD processor that exceeds a predetermined power consumption criteria (e.g., threshold). Step 550 may optionally include avoiding selection of sets of SLAM parameter values whose execution results in heating of the VD processor that exceeds a predetermined heating criteria. Step 550 may optionally include avoiding selection of sets of SLAM parameter values whose execution results in (a) power consumption of the VD processor that exceeds a predetermined power consumption criteria, and (b) heating of the VD processor that exceeds a predetermined heating criteria.

It should be noted that method 500 as a whole, and step 550 in particular, may include defining an operational set of SLAM parameter values which does not maximize the possible computational power and/or other resources. In some cases, this may be in order to optimize the execution of SLAM by the system in another way (e.g., as discussed in the previous paragraph). In some cases, it may be in order to optimize the accuracy of SLAM in specific types of regions. For example, in a very simplistic example and assuming the values of other SLAM parameters are known, the remaining available computational power of the SLAM-based system may allow to set the maximal number of features which may be tracked by the SLAM algorithm to 158, but step 550 may nevertheless include determining the value of this parameter to 152, e.g., because the set of parameters with the 152 value outperformed an otherwise identical set of parameter values with 158 (possibly without significantly affecting other parameters such as power consumption). A likelihood of finding such counterintuitive combinations may be improved by testing many sets of parameter values in step 530 and 540, and by effectively selecting which sets of parameter values to test.

Method 500 may optionally be implemented such that there exist a The reference set of SLAM parameter values differing from the operational set of SLAM parameter values only in that the operational set of SLAM parameter values provides less of an identifiable resource for performance of SLAM (e.g., maximal number of features to track in the example of the previous paragraph), wherein execution of SLAM based on the operational set of SLAM parameter values by the SLAM-based system provides better SLAM accuracy with respect to the 3D model than execution of SLAM based on the reference set of SLAM parameter values. The reference set of SLAM parameter values may be tested in steps 530 and/or 540, but this is not necessarily so.

Step 550 of method 500 may optionally be followed by step 560 of providing the operational set of SLAM parameter values (or data indicative thereof) to the SLAM-based system (equipped at least with a VD processor), for navigating within the first type of region by executing SLAM computer readable code by the VD processor using the operational set of SLAM parameter values. Referring to the examples set forth with respect to the other drawings, step 560 may optionally be executed by processor 220, e.g., facilitated by optional communication module 240. A "VD processor" is a processor capable of applying at least one SLAM algorithm to visual data (or to data derived from VD), such as visual data captured by one or more cameras, one or more LIDAR sensors, and so on. A VD processor may optionally be a dedicated type of processor optimized for processing visual data and/or for executing SLAM algorithms. For example, a VD processor may include one or more GPUs, one or more CPUs, and so on. Optionally, step 560 may also include providing additional parts of the SLAM algorithm to the system (e.g., to be stored and/or executed by the VD processor, by a memory module, or as a combination of both). As aforementioned, in some cases the VD processor to which the operational set of parameters values is provided may be of limited capabilities, and may be incapable of executing general-purpose SLAM algorithms which are suitable to a wider range of operational conditions and/or regions.

It should be noted that while the SLAM algorithm using the operational set of SLAM parameter values may be executed on board of the SLAM-based system, in other implementations the SLAM algorithm may be executed partly or wholly off-board of the SLAM based system. For example, in some cases, SLAM may be performed based on low-quality visual data and/or based on visual data transmitted over a limited bandwidth channel, in which case the lower quality of the video may require tailoring the SLAM algorithm to different types of areas, even if performed by another system, and even if that system has CPU power which is sufficient for executing a general-purpose SLAM algorithm. Previously discussed steps of method 500 may be modified for such an implementation, mutatis mutandis. For example, portable devices with low-quality cameras or with limited bandwidth (e.g., some cellular telephone, some body cameras) may transmit low-quality visual data to a cloud-based or server-based SLAM service, which will perform region-type-based SLAM as discussed above, mutatis mutandis. It is noted that in other cases, such portable devices (e.g., cellular phones, body cameras, etc.) may execute the SLAM algorithm using the operational set of SLAM parameters themselves.

Step 560 may be followed by executing the SLAM algorithm by the one or more VD processor of the SLAM-based system (optionally using additional processors, memory modules, etc., either installed on the SLAM-based system or not). Especially, the executing of this step may be performed when the system is operating within a region of the first type of region.

FIG. 3 is a flow chart illustrating an example of method 600, in accordance with the presently disclosed subject matter. Method 600 is a computerized method for configuring at least one body of navigation computer code for operation of one or more SLAM-based systems in different types of regions. Referring to the examples set forth with respect to the other drawings, method 600 may optionally be executed by system 200, e.g., by processor 220.

Method 600 includes executing different iterations of method 500, such that in each instance different operational sets of SLAM parameter values are determined for SLAM-based systems belonging to a single sub-group of SLAM-based systems (also referred to as "class" in the disclosure). The different operational sets are generated in order to enable one or more SLAM-based systems of this class to operate in different types of regions. The different operational sets of SLAM parameter values determined for the different regions may optionally be used with the same SLAM algorithm, but this is not necessarily so—as discussed above, part of the tailoring of SLAM algorithms to different types of regions and/or for different operational conditions may include selecting different SLAM algorithms for different types of regions and/or for different operational conditions within the same geographical and/or spatial regions. All SLAM-based systems of the aforementioned class are similar at least in that they are all equipped with at least one VD processor each that belongs to a certain VD processor class, and which participates in (or handles) the execution of the respective SLAM algorithm using one or more of the operational sets of SLAM parameter values.

A class of VD processors may optionally include a single model of VD processors. A class of VD processors may optionally include VD processors of a single model. A class of VD processors may optionally include VD processors of a predefined subgroup of models. A class of VD processors may optionally include VD processors having capabilities within predefined limits (e.g., available CPU power of between 0.8-1.3 GFlops).

A class of SLAM-based systems may optionally include SLAM-based systems of a single model (e.g., the model type of drone, the same model of SLAM-enabled body camera). A class of SLAM-based systems may optionally include SLAM-based having a combination of one or more components (e.g., out of VD processor, camera, Lidar, IMU, odometer, and so on), such that all component of the same type (e.g., cameras, lidars) of the different SLAM-based systems of the class are either of the same model, belonging to the same predefined group of models, or having capabilities within a range (e.g., cameras having resolution between 4-10 megapixels).

Step 610 of method 600 includes executing method 500 for determining a first operational set of SLAM parameter values optimized for (a) execution by a class of SLAM-based systems equipped with a VD processor of a VD processor class, and for (b) navigating within a first type of region. For example, step 610 may include determining a first operational set of SLAM parameter values that enables SLAM-based systems of the class of system to operate well in the specific type of region (e.g., warehouse) despite having limited capabilities (e.g., limited GPU).

Step 620 of method 600 includes executing method 500 for determining a second operational set of SLAM parameter values optimized for (a) execution by the class of SLAM-based systems equipped with the VD processor of the VD processor class, and for (b) navigating within a second type of region. For example, step 610 may include determining a second operational set of SLAM parameter values that enables SLAM-based systems of the same class of system to operate well in the specific type of region (e.g., warehouse in different operational conditions, or shopping mall) despite having similar limited capabilities (e.g., limited GPU). Step 620 may optionally be executed by the same system that executes step 610, but this is not necessarily so.

Optionally, method 600 may include additional steps like steps 610 and 620, in which method 500 are executed in additional instances, in order to determine one or more additional operational sets of SLAM parameter values optimized for execution by the class of SLAM-based systems equipped with the VD processor of the VD processor class, to enable such SLAM-based system to navigating within additional types of regions and/or under additional categories of operational conditions.

The two or more operational sets of SLAM parameter values which are suitable for performing SLAM by the SLAM-based system of the class within the respective two or more types of region may be followed by providing different operational sets of SLAM parameter values to different systems of the class of systems (exemplified in FIG. 3 by steps 630 and 640) and/or by providing different both operational sets of SLAM parameter values to a single system (or to a plurality of different systems) of the class of systems (exemplified in FIG. 3 by step 650, which is either an alternative to the branch of method 600 including steps 630 and 640, or executed in addition to that other branch of the method).

Step 630 includes providing the first operational set of SLAM parameter values to a first SLAM-based system belonging to the class of SLAM-based systems for navigating within regions belonging to the first type of region by executing SLAM computer readable code by a first VD processor of the VD processor class using the first operational set of SLAM parameter values. Step 640 includes providing the second operational set of SLAM parameter values to a second SLAM-based system belonging to the class of SLAM-based systems for navigating within regions belonging to the second type of region by executing SLAM computer readable code by a second VD processor of the VD processor class using the second operational set of SLAM parameter values. Additional operational sets of SLAM parameter values determined for other types of regions (if any) may be provided to other systems of the class.

Providing different operational sets of SLAM parameter values to different SLAM-based system of the same class (e.g., to different systems of the same model) may be used, for example, by a manufacturer, in order to make a versions of the same model of a SLAM-based system (e.g., a low-cost system, a low-performance system, a low-energy consumption system) which are suitable to different types of regions and/or to different operational conditions and/or to different scenarios. A single instance of method 500 may be used, for example, in order to tailor such a model of SLAM-based systems (e.g., which are low-cost, low-performance, and/or having low-energy consumption) to a single type of region, even if that system cannot operate effectively and/or efficiently across a wide range of regions using a general-purpose SLAM algorithm. Multiple instances of method 500 in such a scenario (e.g., as part of method 600) may be used to tailor such a model of a system to different use cases, types of regions, etc. In another, an entity which is interested in a model of SLAM based system may execute various instances of method 500 in order to make different units of a batch of similar SLAM-based system suitable to perform SLAM in different environments. Thus, such an entity may utilize less expensive SLAM-based system, for example, and still achieve effective and efficient SLAM in different types of region.

Step 650 includes providing the first operational set of SLAM parameter values and the second operational set of SLAM parameter values to a single SLAM-based system belonging to the class of SLAM-based systems for alternately navigating within regions belonging to the first type of region and within regions belonging to the second type of region, by executing at least one body of SLAM computer readable code by a VD processor of the VD processor class using the first operational set of SLAM parameter values and the second operational set of SLAM parameter values.

Providing different operational sets of SLAM parameter values to a single SLAM-based system may be used, for example, by a manufacturer, in order to make a model of a SLAM-based system (e.g., a low-cost system, a low-performance system, a low-energy consumption system) suitable to operate in different types of regions by using different operational sets of SLAM parameter values, e.g., in cases in which no set of SLAM parameter values allow SLAM-based systems of this model (or, more broadly, this class of SLAM-based systems) to operate in all the relevant types of regions. Multiple instances of method 500 in such a scenario (e.g., as part of method 600) may be used to tailor a single SLAM-based system to different use cases, types of regions, etc. Thus, a less expensive SLAM-based system, for example, may still provide an effective and efficient SLAM in different types of region.

Step 650 may be followed by step 660 of alternatingly performing SLAM using the first operational set of SLAM parameter values and performing SLAM using the second operational set of SLAM parameter values (and possibly performing SLAM using additional sets of SLAM parameter values, if applicable). For example, a SLAM-based system (e.g., a drone) may use one operational set of SLAM parameter values when navigating over a neighborhood, and another operational set of SLAM parameter values when navigating over open field. In another example, a SLAM-based system may use one operational set of SLAM parameter values when navigating a region during daytime (the first type of region pertaining both to the spatial region and to high illumination levels, in this example), and another operational set of SLAM parameter values when navigating the same spatial region during nighttime (the second type of region pertaining both to the same type of spatial region and to lower illumination levels, in this example).

The timing of the alternation between two (or more) operational sets of SLAM parameter values may be determined in any suitable manner such as: predefined, based on timing cues, based on sensor data, based on instruction of a human, based on instruction of another system, based on navigational performance level, based on SLAM performance level, based on resource consumption of SLAM execution, etc.

Optionally, the second SLAM-based system is the first SLAM-based system that is operable to alternate between using the first operational set of SLAM parameter values when navigating the first type of region and using the second operational set of SLAM parameter values when navigating the second type of region. Optionally, method 600 may include detecting deterioration in performance of SLAM using the first operational set of SLAM parameter values, and based on the detection triggering navigation using the second operational set of SLAM parameter values. The detecting may be executed by the SLAM-based system or by another system (e.g., a recipient of results of the SLAM-based algorithm and/or of results of the navigating by the SLAM-based system).

Pertaining to both methods 500 and 600, it is noted that in some examples, an operational set of SLAM parameter values suitable for one type of region (e.g., suburban streets) may also perform acceptably in another type of region (e.g., highway), but may be outperformed by a more dedicated operational set of SLAM parameter values which is tailored specifically for the other type of region. In such case, for example, the SLAM-based system may switch to another operational set of SLAM parameter values not because the operational set of SLAM parameter values is failing, but in order to improve performance, lower energy consumption, lowing computational load, or for any other reason.

FIG. 4 illustrates configuring navigation computer code for one or more SLAM-based systems, in accordance with examples of the presently disclosed subject matter. In diagrams 4A and 4B, at least one training-data collecting system 110 traverses one or more regions of the same type of region; in the illustrated example, the type of region is "parking lot". Curves 412 and 414 represent the different trajectories of the at least one system 110 during collection of two recordings of visual data by the at least one system 110. While only two curves are illustrated in the example, it is clear that any number of recordings may be implemented, e.g., in accordance with the requirements of the process for the relevant type of SLAM-based system, based on the type of region, and so on. Curves 422, 424, and 426 represent the different trajectories of the at least one system 110 during collection of three recordings of visual data by the at least one system 110, at different operational conditions. For example, recordings 412 and 414 may be collected at times of lower illumination levels (e.g., night, evening, dusk, winter) while recordings 422, 424, and 426 may be collected at times of higher illumination levels (e.g., daytime, summer). While not necessarily so, one or more training-data collecting system 110 (either one that was used for collecting of the VD recordings or not) may be used for collecting VD data for the generation of the 3D model (in case generation of model based on recorded data is implemented). One or more training-data collecting systems 110 may optionally further collect additional data (e.g., IMU data, odometer data, GPS data, data pertaining to operational conditions or measurements thereof, and so on). Referring to the examples set forth with respect to method 500, diagrams 4A and 4B may represent an implementation of steps 510 and/or 520.

In diagrams 4C and 4D, a trajectory of a single recording out of the one or more VD recordings executed under the respective operational conditions is shown by way of an illustrative example (trajectories 412 and 424, respectively). Based on at least a portion of the recorded VD data of each VD recording, multiple trajectories are generated using different combinations ("sets") of SLAM parameter values. This is represented by trajectory 432 in diagram 4C, and by trajectories 442 and 444 in diagram 4D. It should be noted that the number of sets of parameters tested for each recording (and correspondingly, the number of generated trajectories) may greatly exceed these illustrated example. For example, step 530 (which is represented by diagrams 4C and 4D) may include generating for each recording tens, hundreds, thousands, tens of thousands, or more trajectories, using different combinations of parameter values. The accuracy of each of the generated trajectories with respect to the 3D model and/or with respect to the actual trajectory (e.g., 412, 424) is computed and serves as a basis for a performance evaluation associated with the respective set of SLAM parameter values (e.g., as part of step 540). As aforementioned, additional aspects of SLAM performance may be included in the respective evaluations.

Based on the different performance evaluations corresponding to the two or more operational conditions (and optionally on additional data as well), an operational set of SLAM parameter values is determined, and provided to one or more SLAM-based systems 100. Such systems may be able to move autonomously (possibly based on the SLAM algorithm outputs), but this is not necessarily so. Examples of SLAM-based systems which are carried passively are provided with respect to FIG. 7. Diagrams 4E and 4F illustrates SLAM-based systems 100 navigating in regions of the first type of region (e.g., "parking lot") which may optionally be different than the region (or regions) used for the collection of the training data. It is noted that optionally, SLAM-based systems 100 may utilize the determined operational set of SLAM parameter values in operational conditions which were not tested during method 500.

Figure 5A:
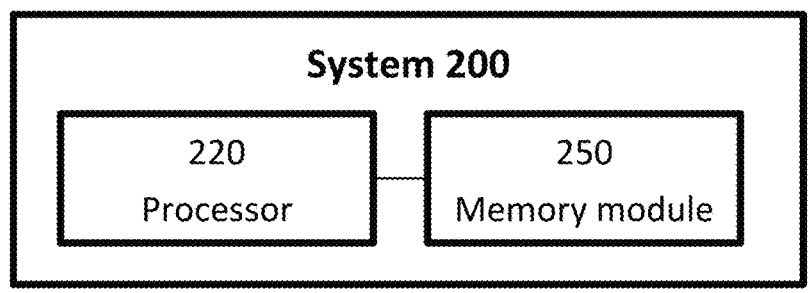
FIGS. 5A and 5B are functional block diagrams illustrating examples of computerized systems for configuring navigation computer code for SLAM-based system.
Figure 5B:
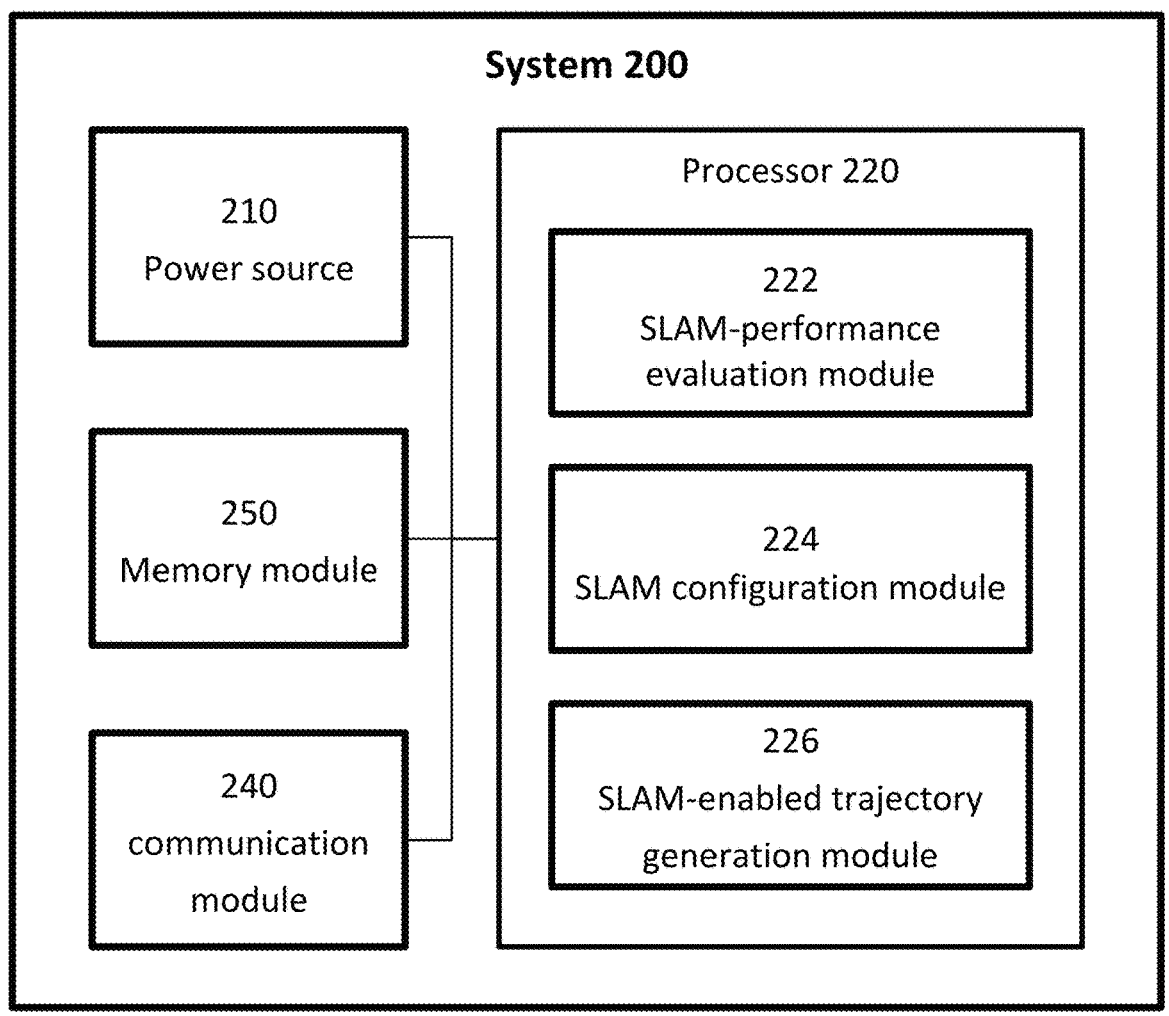

FIGS. 5A and 5B are functional block diagrams illustrating examples of system 200, in accordance with the presently disclosed subject matter. System 200 is a computerized system for configuring navigation computer code for SLAM-based system. System 200 includes at least processor 220 and memory module 250. Memory module 250 is a non-tangible memory (which may include one or more physical memory apparatuses) that is operable to store different types of data, including at least:

a) A three-dimensional (3D) model of a region of a first type of region (e.g., similar to the 3D model and its variations discussed above with respect to method 500).

b) A plurality of first-recording trajectories, each first-recording trajectory comprising an assessment of movement of a first visual data (VD) collector through the region during collection of a first VD recording by the first VD collector, wherein each first-recording trajectory is generated from the first VD recording by application of SLAM using a different corresponding set of SLAM parameter values out of a first plurality of sets. The first-recording trajectories may be generated by system 200 and/or by any other system.

c) A plurality of second-recording trajectories, each second-recording trajectory comprising an assessment of movement of a second VD collector through the region during collection of a second VD recording by the second VD collector, wherein each second-recording trajectory is generated from the second VD recording by application of SLAM using a different corresponding set of SLAM parameter values out of a second plurality of sets. The second-recording trajectories may be generated by system 200 and/or by any other system.

d) Computer program code including instructions for configuring navigation computer code for SLAM-based systems (e.g., for configuring specific SLAM parameter values specific to certain types of regions). For example, the computer program code stored on memory module 250 may include instructions for executing some or all of the steps of method 500 and/or of method 600.

The non-tangible memory 250 and the computer program code are configured, with processor 220, to cause computerized system 200 to:

a) Generate for each set of SLAM parameter values out of the first plurality of sets a performance evaluation of a performance of the respective set of SLAM parameter values under the first operational conditions. While the performance evaluation may be indicative of varied aspects of performance of SLAM using the respective set of SLAM parameter values (e.g., as discussed above with respect to method 500), it is at least indicative of—and based at least one—accuracy with respect to the 3D model of a respective first-recording trajectory associated with the respect set of SLAM parameter values. This way, system 200 yields a first plurality of performance evaluations pertaining to the first operational conditions. Any one or more of these performance evaluation may optionally be stored by non-tangible memory 250.

b) Generate for each set of SLAM parameter values out of the second plurality of sets a performance evaluation of a performance of the respective set of SLAM parameter values under the second operational conditions. While the performance evaluation may be indicative of varied aspects of performance of SLAM using the respective set of SLAM parameter values (e.g., as discussed above with respect to method 500), it is at least indicative of—and based at least one—accuracy with respect to the 3D model of a respective second-recording trajectory associated with the respect set of SLAM parameter values. This way, system 200 yields a second plurality of performance evaluations pertaining to the second operational conditions. Any one or more of these performance evaluation may optionally be stored by non-tangible memory 250.

While not necessarily so, processor 220 may include SLAM-performance evaluation module 222 that is operable to generate the performance evaluations as discussed above. It is noted that in cases additional data is required for the generation of the performance evaluations, such data may be created by system 200 and/or obtained from other systems. Such data may include, for example, information pertaining to the process of generating the respective trajectory (e.g., the duration of the trajectory generation process, the computational power it required, the energy it required, the temperature changes in the processor which executed it, and so on). Such additional data may optionally be stored by memory module 250. Optionally, processor 220 (and optionally SLAM-performance evaluation module 222) may be configured to implement step 540, or any variation of which that is discussed above.

The non-tangible memory 250 and the computer program code are further configured, with processor 220, to cause computerized system 200 to determine an operational set of SLAM parameter values for a SLAM-based system, based at least on the first plurality of performance evaluations and on the second plurality of performance evaluations. While not necessarily so, processor 220 may include SLAM configuration module 224 that is operable to determine the operational set of SLAM parameter values. Optionally, processor 220 (and optionally SLAM configuration module 224) may be configured to implement step 550, or any variation of which that is discussed above.

Processor 220 (and optionally SLAM configuration module 224) may determine the operational set of SLAM parameter values be based on performance evaluations of various factors, including at least an evaluation of accuracy with respect to the 3D model of the respective trajectories (including at least trajectories corresponding to the first sets of SLAM parameter values and to the second sets of SLAM parameter values). Processor 220 may select one of the tested sets of parameters (e.g., tested by SLAM-performance evaluation module 222) as the operational set of SLAM parameter values, but this is not necessarily so. Optionally, processor 220 may be configured to determine a novel set of SLAM parameter values that have not been tested (e.g., not been tested by SLAM-performance evaluation module 222), optionally based on any one or more of the aforementioned sets of parameters, and possibly on other available data as well. The determining of the operational set of SLAM parameter values by processor 220 (e.g., by SLAM-performance evaluation module 222) may be implemented in any suitable technique. For example, SLAM parameter values for the operational set of SLAM parameter values may be obtained by averaging tested values of these parameters based on the associated performance evaluations, may be obtained by modifying specific tested parameter values according to predetermine rules, may be determined based on the performance evaluations using machine learning (ML) algorithms, or in any other suitable way.

The determining of the operational set of SLAM parameter values by processor 220 may include determining all of the parameter values required for operation of the SLAM algorithm, or any subgroup and/or combination of multiple parameter values required for operation of the SLAM algorithm. For example, some of the parameter values may be predetermined or dictated by requirements of the SLAM-based system for which the algorithm is intended, while other parameters may be tailored by system 200. In several of the possible implementations of system 200, the determining of the operational set of SLAM parameter values may include determining parameter values for any combination of one or more of the following aforementioned parameters (and possibly additional parameter values): Maximal number of features to track, Resolution downscale, Color scheme, Tracking frequency, Matching frequency, Frame comparison method, Fundamental confidence, Estimation iterations, Step size, Minimum features for loop closure detection, Loop closure weight value, Optimization frequency, IMU filter use, Detector+descriptor type, Inertial bias model, Image equalization usage, Feature depth in triangulation, Maximal RANSAC iterations, Minimal distance between features, and Minimal feature quality. In several of the possible implementations of system 200, the determining of the operational set of SLAM parameter values may include determining parameter values for parameters relating to any combination of one or more of the following (and possibly additional parameter values): tracked features, image resolution, 3D model resolution, rate, frequency, or number of iteration of any one or more SLAM computations and/or functions, threshold parameters, bad features, data smoothing, data cleansing, SLAM loop closure detection, SLAM pose graph, IMU data, navigational data, component operational parameters (e.g., of camera, LIDAR, IMU, processor), SLAM description.

The non-tangible memory 250 and the computer program code may be further configured, with processor 220, to cause computerized system 200 to provide the operational set of SLAM parameter values to one or more SLAM-based system which are equipped with VD processor, for navigating within the first type of region by executing SLAM computer readable code by the VD processor using the operational set of SLAM parameter values. The provisioning of the operational set of SLAM based parameters may be facilitated by an optional communication module 240, or in any other suitable way. Communication module 240 may implement any suitable communication hardware, software, protocol etc. (e.g., wired and/or wireless, analog and/or digital, etc.). Optionally, processor 220 may be configured to provide the operational set of SLAM parameter values along with additional information such as any one or more of the following: SLAM algorithm computer code for executing SLAM using the operational set of SLAM parameter values, description of the first type of region and/or features by which to identify such a region, description of the operational conditions for which the operational set is suitable and/or features by which to identify such operational conditions, and so on. The operational set of SLAM based parameter, as well as any optional additional data, may be provided to directly to the at least one SLAM-based system which is to execute SLAM using these parameter values, but it may also be optionally provided via one or more intermediate systems.

The non-tangible memory 250 and the computer program code may optionally be configured, with processor 220, to cause computerized system 200 to:
a) Obtain a plurality of recordings of visual data by one or more VD collectors traversing the region (e.g., as defined with respect to method 500 above) under different operational conditions.
b) Apply SLAM to the plurality of VD recordings using various plurality of sets of SLAM parameter values, thereby generating using each of the sets a corresponding trajectories assessing movement of one or more corresponding VD collectors within the region during the collection of the respective VD recording.

While not necessarily so, processor 220 may include SLAM-enabled trajectory generation module 226 that is operable to generate the trajectories as discussed above. For example, the non-tangible memory 250 and the computer program code may optionally be configured, with processor 220 (e.g., with optional SLAM-enabled trajectory generation module 226) to cause computerized system 200 to:
a) Obtain a plurality of recordings of visual data by one or more VD collectors traversing the region (e.g., as defined with respect to method 500 above) under different operational conditions. The plurality of recordings includes at least: (a) one or more first recordings of VD by at least one first VD collector traversing the region at first operational conditions, and (b) one or more second recordings of VD by at least one second VD collector traversing the region at second operational conditions. (the at least one first VD collector the at least one second VD collector can be the same, different, or partly overlapping group of VD collectors).
b) Apply SLAM to the first recording using a first plurality of sets of SLAM parameter values, thereby generating using each of the sets of the first plurality of sets a corresponding first-recording trajectory assessing movement of the first VD collector within the region during the collection of the first VD recording.
c) Apply SLAM to the second recording using a second plurality of sets of SLAM parameter values, thereby generating using each of the sets of the second plurality of sets a corresponding second-recording trajectory assessing movement of the second VD collector within the region during the collection of the second VD recording.

It is noted that any feature, possibility, variation, combination, etc. discussed above with respect to method 500 and/or with respect to method 600 may be applied, mutatis mutandis, to system 200. While many such details are not repeated in the interest of concision, few are stated below for greater clarity.

Referring to system 200 as a while, optionally there is a plurality of overlapping sets of SLAM parameter values which is included in the first plurality of sets and in the second plurality of sets.

Optionally, the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

Optionally, the non-tangible memory and the computer program code may be configured, with the at least one processor, to cause the computerized system to generate as part of the performance evaluations an accuracy evaluation and a resources consumption evaluation for each set out of a group of sets that includes (a) at least one set out of the first plurality of sets and (b) at least one another set out of the second plurality of sets. In such case, the non-tangible memory and the computer program code may be further configured, with the at least one processor, to cause the computerized system to balance, in the determining of the operational set of SLAM parameter values, between accuracy and resource consumption by the operational set of SLAM parameter values. For example, this may include selecting between a first set of operational SLAM parameters which provide higher accuracy at higher resource consumption in the first type of region and a second set of operational SLAM parameters which provide lower accuracy at lower resource consumption in the first type of region.

Optionally, the at least one first recording and the at least one second recording may be based on recorded VD collected by a sensor group including at least one VD sensor being installed on a navigable platform when the navigable platform traverses the region (in one or more instances). In such cases, the 3D model may optionally be generated based on VD collected by at least one high-quality VD sensor installed on the navigable platform concurrently to the collection of the recorded VD.

Optionally, the at least one first VD recordings and/or the at least one second VD recordings may be generated by downgrading VD collected by the at least one high-quality VD sensor. Optionally, the non-tangible memory and the computer program code may be configured, with the at least one processor, to cause the computerized system to generate VD recordings (such as the first VD recordings and/or the second VD recordings) by downgrading VD collected by the at least one high-quality VD sensor. The VD collected by the at least one high-quality VD sensor may be the same data used for the generation of the 3D model, if applicable, but this is not necessarily so.

Optionally, the sets of the first plurality of sets and the sets of the second plurality of sets each include different values of: (a) maximal number of features to track, (b) degree of resolution downscaling for feature extraction, and (c) posegraph loop closing parameters.

Optionally, there exists a reference set of SLAM parameter values (which may be actually tested or evaluated by system 200 or not), such that the operational set of SLAM parameter values and a reference set of SLAM parameter values differ only in that the operational set of SLAM parameter values provides less of an identifiable resource for performance of SLAM, wherein execution of SLAM based on the operational set of SLAM parameter values by the SLAM-based system provides better SLAM accuracy with respect to the 3D model than execution of SLAM based on the reference set of SLAM parameter values.

Optionally, the non-tangible memory and the computer program code may be configured, with the at least one processor, to cause the computerized system to avoid determining an operational set of SLAM parameter values whose execution results in at least one of: (a) power consumption of the VD processor that exceeds a predetermined power consumption criteria, and (b) heating of the VD processor that exceeds a predetermined heating criteria.

Optionally, the non-tangible memory and the computer program code may be further configured, with the at least one processor, to determine a plurality of operational sets of SLAM parameter values based on corresponding 3D models and VD recordings and on performance analysis of different sets of SLAM based parameters, and to provide the plurality of operational sets to at least one SLAM-based system for navigation within region of different types of regions, wherein each of the operational sets of parameters is usable for optimizing performance of SLAM by SLAM-based system of a class of SLAM-based systems for a different type of region out of the different types of regions.

In such cases, the first SLAM-based system and the second SLAM-based system may be functionally equivalent, wherein the first VD processor and the second VD processor are functionally equivalent. Optionally, the first SLAM-based system may outperform the second SLAM-based system in regions of the first type of region, and the second SLAM-based system may outperform the first SLAM-based system in regions of the second type of region.

Optionally, the aforementioned second SLAM-based system may actually be the first SLAM-based system (i.e., there is only one SLAM-based system being referred to in different names). That system may be operable to alternate between using the first operational set of SLAM parameter values when navigating the first type of region and using the second operational set of SLAM parameter values when navigating the second type of region.

It is noted that system 200 may include other components known in the art, such as optional power source 210 which is operable to provide power to any one or more of the other components of system 200, etc.

Figure 6A:
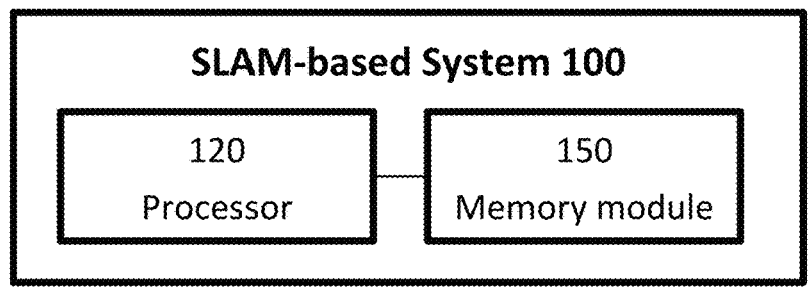
FIGS. 6A and 6B are functional block diagrams illustrating examples of SLAM-based system.
Figure 6B:
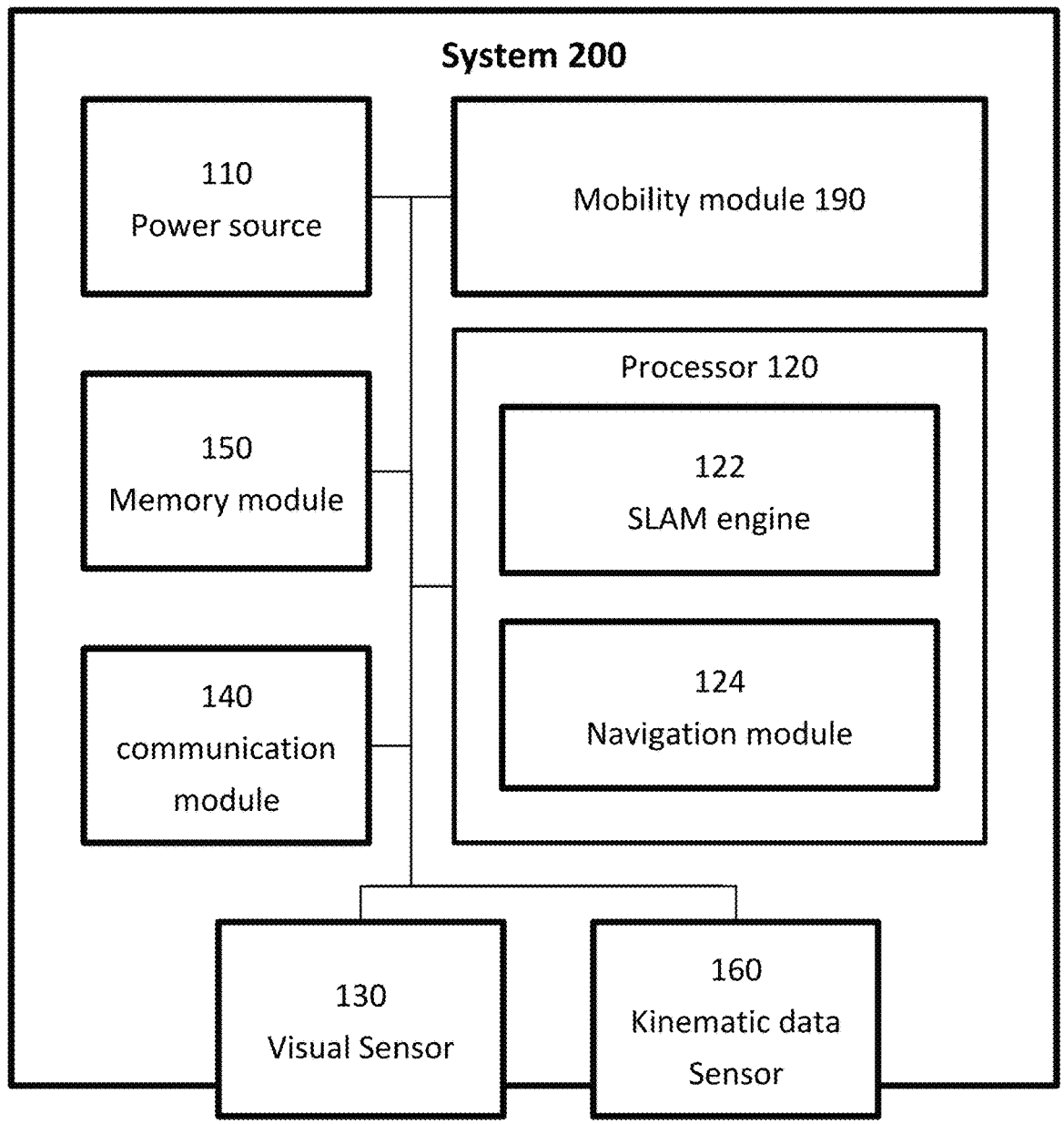

FIGS. 6A and 6B are functional block diagrams illustrating examples of SLAM-based system 100, in accordance with the presently disclosed subject matter. SLAM-based system 100 is operable to execute SLAM algorithm using at least one operational set of SLAM parameter values determined to a specific type of region, while moving within that region. While not necessarily so, SLAM-based system 100 may execute at least one SLAM algorithm using one or more sets of SLAM parameter values determined by system 200 and/or by executing method 500.

System 100 includes at least processor 120 and memory module 150. Memory module 150 is a non-tangible memory (which may include one or more physical memory apparatuses) that is operable to store different types of data, including at least:

a) Visual data acquired by one or more sensors that are connected to memory module 150 and optionally also to processor 120. If such a sensor (or sensors) is a part of system 100, it is denoted sensor 130. A sensor which collects the visual data may have any of the characteristics and/or features discussed above with respect to the VD collectors of method 500. Such VD data may include images, video, point cloud, or any other suitable format of visual data. Such visual data may optionally be collected in real time. The visual data may be provided directly by the sensor, or via an intermediate system or unit. The visual data may be provided exactly as collected by the respective one or more sensors, or may be preprocessed in any way facilitating the operation of system 100.

b) Optionally, kinematic data that is collected by one or more kinematic data sensors that are connected to memory module 150 and optionally also to processor 120. If such a sensor (or sensors) is a part of system 100, it is denoted kinematic data sensor 160. For example, such sensors may include: accelerometer, gyroscope, Inertial Measurement Unit (IMU), satellite navigation system (e.g., GPS), odometer, etc.

c) At least one operational set of SLAM parameter values, each set determined specifically for operation within at least one specific type of region (e.g., "warehouse", "warehouse or mall", "parking lot", "parking lot or urban road").

d) Computer program code including instructions for performing SLAM using the at least one operational set of SLAM parameter values and based on the visual data and/or the kinematic data.

The non-tangible memory 150 and the computer program code are configured, with processor 120, to cause computerized system 100 to perform SLAM by processing visual data from its environment (e.g., the visual data stored by memory module 150) using an operational set of SLAM parameter values stored by memory module 150.

The non-tangible memory 150 and the computer program code are configured, with processor 120, to cause SLAM-based system 100 to navigate within one or more types of regions. Different SLAM-based systems 100 provided with one or more operational sets of SLAM parameter values as taught in this disclosure may use these one or more operational sets for navigation by performing in the relevant region (or the relevant region type) a combination of one or more of the following actions using the respective one or more sets of parameters: mapping an area (e.g., mapping the region or part of the region which the respective system travers), localization, path planning, obstacle detection and avoidance, waypoint following, autonomous maneuvering, exploration, Manipulation of the environment (e.g., controllably moving obstacles in the region).

System 100 may optionally include a mobility module 190 which includes one or more components which participate in enabling and/or directing the motion of system 100 within the region, such as any one or more of: engine, wheels, propellers, motor controllers, etc. One or more of this components may be controlled (directly or indirectly) by processor 120 (e.g., by navigation module 124 thereof). It is noted that system 100 may include other components known in the art, such as optional power source 110 which is operable to provide power to any one or more of the other components of system 100, etc. Such navigation module may, for example, execute navigation algorithms based on output of optional SLAM engine 122 which executes SLAM algorithms as discussed throughout this disclosure.

System 100 may optionally be an active system operable to mobilize itself within the region. System 100 may optionally be a passive system carried around within the region (e.g., by a person, animal, or another system or platform) or moving passively otherwise (e.g., carried by the winds or water currents).

Optionally, the non-tangible memory 150 and the computer program code may be configured, with processor 120, to cause SLAM-based system 100 to alternately use different operational sets of SLAM based parameters for navigation at different times. For example, the non-tangible memory 150 and the computer program code may be configured, with processor 120, to cause SLAM-based system 100 to switch between using different operational sets of SLAM parameter values for navigation in any one or more of the following cases:
 a) Upon receiving relevant instructions from a human operator.
 b) Upon receiving relevant instructions from another machine.
 c) Upon obtaining an indication that the system switched to operation in another type of region (either detecting this itself or receiving indication from an auxiliary source).
 d) Upon obtaining an indication that performing SLAM using the presently used operational set of SLAM parameter values does not meet a predefined performance criteria (either detecting this itself or receiving indication from an auxiliary source, such as a recipient of the SLAM output data).

Optionally, SLAM-based system 100 may be operable to detect deterioration in performance of SLAM using a first operational set of SLAM parameter values, and to trigger-based on that detection-navigation using a second operational set of SLAM parameter values.

Optionally, SLAM-based system 100 may include an optional communication module 140, for communicating with other systems. Optional communication module 140 may utilize wireless and/or wired communication protocols, many of which are known in the art. By way of example, SLAM-based system 100 may transmit to one or more external system outputs of the SLAM-based algorithms, sensed data, or other collected information from the environment through which SLAM-based system 100 traverses, and so on. By way of example, SLAM-based system 100 may receive from an external system instructions, additional layers of information for a map generated by SLAM-based system, and so on.

Figure 7:
FIG. 7 illustrates passive SLAM-based systems carried by people.

FIG. 7 illustrates two passive SLAM-based systems 100 carried by people (e.g., firefighters, first responders), in accordance with examples of the presently disclosed subject matter. For example, SLAM-based system 100 may be a SLAM-enabled body camera. In some cases, there is a need to generate a map, a 2D model, or a 3D model of a region in which people and/or machine operate, and optionally to determine the locations of these different entities within this region. For example, a plurality of SLAM-based systems 100 may be carried by people, machines (e.g., drone, tactical robot, bomb disposal robot) operating within the same region. Each of these systems 100 may create its own map and transmit it to a server or another main computer, where all the different maps can be combined to gradually create a comprehensive map of the region. Systems which are carried by people can only have limited weight, limited battery, and preferably a limited cost. Therefore, such systems usually implement lower quality components which are available, for example, for a self-navigating car. Therefore, method 500 may be used in order to enable to use such systems for SLAM, despite their possible shortcomings, by adapting these systems 100 for operation within specific types of regions.

For example, most of the SLAM technologies today require high computing power (for example eight core processors like intel i7, or ryzen r7, or jetson xavier) in order to run any SLAM in real time. Computers like those weigh over 400-500 gr, to which additional components like battery, camera, etc. should be added. The weight, power consumption, and costs of such system may simply render their utilization for SLAM nonpractical in many use cases, for which SLAM-based system 100 may be used.

For example, in emergencies, when entering unfamiliar locations, first responder teams divide into sub-squads or individuals. Prior art command centers lack real-time information pertaining to each individual's location as well as special data of the deployed area. Such information is needed for greater safety, management, coordination, and overall operational efficiency. Each team member can carry a small, low-weight system 100 body camera which, by performing SLAM using an operational set of SLAM parameter values tailors to the specific type of region, transmit real-time (or near-real time) precise localization data of each team member (e.g., within a building or a structure where GPS is unavailable) on a comprehensive real-time map. This information enhances situational awareness for mission commanders, enabling them to make informed decisions, allocate resources effectively, facilitate better coordination, and efficiently manage the emergency.

Figure 8C:
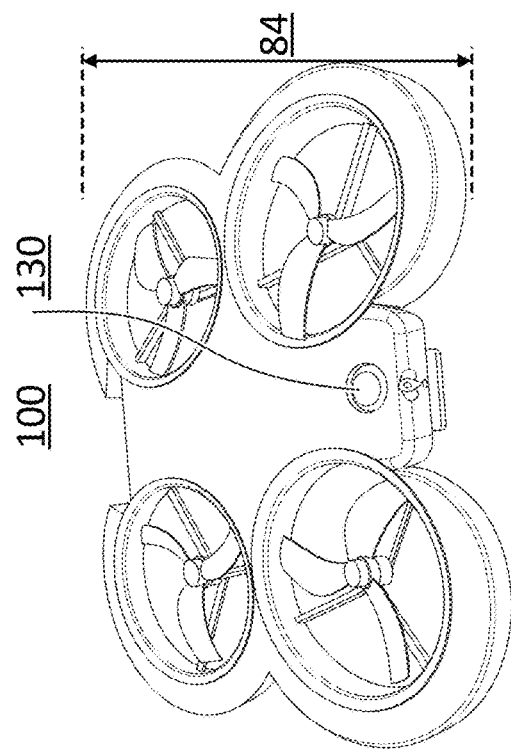
FIGS. 8A, 8B, and 8C illustrate three nonlimiting examples of SLAM-based systems.
Figure 8B:
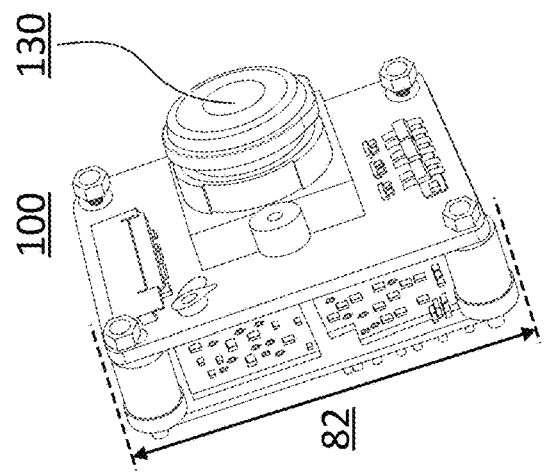
Figure 8A:
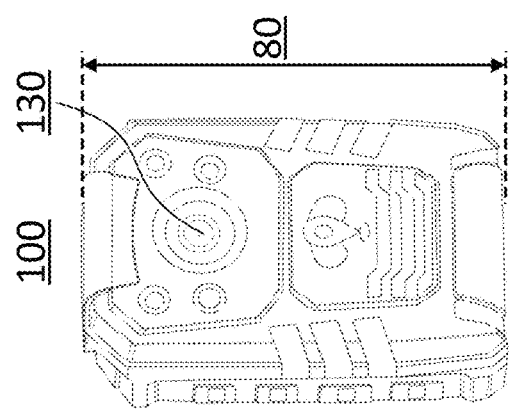

FIGS. 8A, 8B, and 8C illustrate three nonlimiting examples of SLAM-based systems, in accordance with examples of the presently disclosed subject matter.

As exemplified in FIG. 8A, SLAM-based system 100 may be a handheld system and/or a wearable system and/or an otherwise portable carriable system. Optionally, SLAM-based system 100 may include a handle, a strap (e.g., shoulder strap), a clip-on mount, a magnet mount, a Velcro mount, an adhesive mount, a button mount, or any other type of connection mechanism (either detachable or non-detachable) for connecting and/or supporting SLAM-based system 100 by a person, by clothing or other apparatuses carried or worn by a person, by a portable machine, by an animal, and so on. The size of such a portable and/or handheld and/or carriable SLAM-based system 100 (e.g., as exemplified in FIG. 8A) may differ, e.g., according to the required use. For example, a longitudinal dimension of SLAM-based system 100 (denoted 80 in FIG. 8A) may be between 2-5 cm, between 5-10 cm, between 10-20 cm, between 20-40 cm, or even longer.

As exemplified in FIG. 8B, SLAM-based system 100 may be designed to be carried by a moving platform such as a car, other land vehicle, marine vehicle, or airborne vehicle, by a robot, etc. Optionally, SLAM-based system 100 may include a suitable mounting mechanism (either detachable or non-detachable) for connecting and/or supporting SLAM-based system 100 to such a system. The size of such a portable SLAM-based system 100 (e.g., as exemplified in FIG. 8B) may differ, e.g., according to the required use. For example, a longitudinal dimension of SLAM-based system 100 (denoted 82 in FIG. 8B) may be between 2-5 cm, between 5-10 cm, between 10-20 cm, between 20-40 cm, between 40-100 cm or even longer.

As exemplified in FIG. 8C, SLAM-based system 100 may be an entire self-movable system (e.g., a drone, such as a quad drone) designed to self-navigate within an unknown or a partly unknown environment. Such a self-movable system (whether fully autonomous, partly autonomous, remote controlled, manned, etc.) may be, for example, a car, other land vehicle, marine vehicle, or airborne vehicle, by a robot, etc. The size of such a self-movable SLAM-based system 100 (e.g., as exemplified in FIG. 8C) may differ, e.g., according to the required use. For example, a longitudinal dimension of SLAM-based system 100 (denoted 84 in FIG. 8C) may be between 2-5 cm, between 5-10 cm, between 10-20 cm, between 20-40 cm, between 40-100 cm or even longer.

Reverting to method 500, it is noted that method 500 and any of its variants discussed or suggested above may be implemented by any suitable computer readable medium, as a computer readable code executed by one or more processors. For example, according to an aspect of the presently disclosed subject matter, there is disclosed a non-transitory computer-readable medium for configuring navigation computer code for a Simultaneous Localization and Mapping (SLAM) based system, including instructions stored thereon, that when executed on a processor, perform the steps of:

a) obtaining a three-dimensional (3D) model of a region of a first type of region;

b) acquiring a first recording of visual data (VD) by at least one first VD collector traversing the region at first operational conditions and a second recording of VD by at least one second VD collector traversing the region at second operational conditions;

c) applying SLAM to the first recording using a first plurality of sets of SLAM parameter values, thereby generating using each of the sets of the first plurality of sets a corresponding first-recording trajectory assessing movement of the first VD collector within the region during the collection of the first VD recording;

d) for each set of SLAM parameter values out of the first plurality of sets, generating a performance evaluation of a performance of the respective set of SLAM parameter values under the first operational conditions, based at least on accuracy of the respective first-recording trajectory with respect to the 3D model; thereby yielding a first plurality of performance evaluations pertaining to the first operational conditions;

e) applying SLAM to the second recording using a second plurality of sets of SLAM parameter values, thereby generating using each of the sets of the second plurality of sets a corresponding second-recording trajectory assessing movement of the second VD collector within the region during the collection of the second VD recording;

f) for each set of SLAM parameter values out of the second plurality of sets, generating a performance evaluation of a performance of the respective set of SLAM parameter values under the second operational conditions, based at least on accuracy of the respective second-recording trajectory with respect to the 3D model; thereby yielding a second plurality of performance evaluations pertaining to the second operational conditions;

g) based at least on the first plurality of performance evaluations and on the second plurality of performance evaluations, determining an operational set of SLAM parameter values for a SLAM-based system; and h) providing the operational set of SLAM parameter values to the SLAM-based system that is equipped with VD processor, for navigating within the first type of region by executing SLAM computer readable code by the VD processor using the operational set of SLAM parameter values.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

While the embodiments described above are provided as examples, it should be understood that various modifications and substitutions may be made without departing from the scope of the presently disclosed subject matter as defined in the appended claims.

What is claimed is:

1. A computerized method for configuring navigation computer code for a Simultaneous Localization and Mapping (SLAM) based system, the method comprising:

obtaining a three-dimensional (3D) model of a region of a first type of region;

acquiring a first recording of visual data (VD) by at least one first VD collector traversing the region at first operational conditions and a second recording of VD by at least one second VD collector traversing the region at second operational conditions;

applying SLAM to the first recording using a first plurality of sets of SLAM parameter values, thereby generating using each set of the first plurality of sets a corresponding first-recording trajectory assessing movement of the first VD collector within the region during the collection of the first VD recording;

for each set of SLAM parameter values out of the first plurality of sets, generating a performance evaluation of a performance of the respective set of SLAM parameter values under the first operational conditions, based at least on accuracy of the respective first-recording trajectory with respect to the 3D model, thereby yielding a first plurality of performance evaluations pertaining to the first operational conditions;

applying SLAM to the second recording using a second plurality of sets of SLAM parameter values, thereby generating using each set of the second plurality of sets a corresponding second-recording trajectory assessing movement of the second VD collector within the region during the collection of the second VD recording;

for each set of SLAM parameter values out of the second plurality of sets, generating a performance evaluation of a performance of the respective set of SLAM parameter values under the second operational conditions, based at least on accuracy of the respective second-recording trajectory with respect to the 3D model, thereby yielding a second plurality of performance evaluations pertaining to the second operational conditions;

based at least on the first plurality of performance evaluations and on the second plurality of performance evaluations, determining an operational set of SLAM parameter values for a SLAM-based system; and providing the operational set of SLAM parameter values to the SLAM-based system which is equipped with VD processor, for navigating within the first type of region by executing SLAM computer readable code by the VD processor using the operational set of SLAM parameter values.

2. The method according to claim 1, wherein a plurality of overlapping sets of SLAM parameter values is comprised in the first plurality of sets and in the second plurality of sets.

3. The method according to claim 1, wherein the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

4. The method according to claim 1, wherein the generating of the performance evaluations for each set out of a group of sets that comprises at least one set out of the first plurality of sets and at least one another set out of the second plurality of sets comprises: generating an accuracy evaluation and a resources consumption evaluation, wherein the determining comprises balancing between accuracy and resource consumption by the operational set of SLAM parameter values.

5. The method according to claim 1, wherein the first recording and the second recording are based on recorded VD collected by a sensor group comprising at least one VD sensor being installed on a navigable platform when the navigable platform traverses the region; wherein the 3D model is generated based on VD collected by at least one high-quality VD sensor installed on the navigable platform concurrently to the collection of the recorded VD.

6. The method according to claim 5, wherein the first VD recording is generated by downgrading VD collected by the at least one high-quality VD sensor.

7. The method according to claim 1, wherein the sets of the first plurality of sets and the sets of the second plurality of sets each comprise different values of: (a) maximal number of features to track, (b) degree of resolution downscaling for feature extraction, and (c) pose-graph loop closing parameters.

8. The method according to claim 1, wherein the operational set of SLAM parameter values and a reference set of SLAM parameter values differ only in that the operational set of SLAM parameter values provides less of an identifiable resource for performance of SLAM, wherein execution of SLAM based on the operational set of SLAM parameter values by the SLAM-based system provides better SLAM accuracy with respect to the 3D model than execution of SLAM based on the reference set of SLAM parameter values.

9. The method according to claim 1, wherein the determining comprises avoiding selection of sets of SLAM parameter values whose execution results in at least one of: (a) power consumption of the VD processor that exceeds a predetermined power consumption criteria, and (b) heating of the VD processor that exceeds a predetermined heating criteria.

10. A computerized method for configuring at least one navigation computer code for operation of SLAM-based systems in different types of regions, the method comprising:

executing the method of claim 1 for providing a first operational set of SLAM parameter values to a first SLAM-based system which is equipped with a first VD processor, for navigating within a first type of region by executing SLAM computer readable code by the first VD processor using the first operational set of SLAM parameter values; and executing the method of claim 1 for a second type of region that is different than the first type of region, for providing a second operational set of SLAM parameter values to a second SLAM-based system which is equipped with a second VD processor, for navigating within the second type of region by executing SLAM computer readable code by the second VD processor using the second operational set of SLAM parameter values;

wherein the first SLAM-based system and the second SLAM-based system are functionally equivalent, wherein the first VD processor and the second VD processor are functionally equivalent;

wherein the first SLAM-based system outperforms the second SLAM-based system in regions of the first type of region, wherein the second SLAM-based system outperforms the first SLAM-based system in regions of the second type of region.

11. The method according to claim 10, wherein the second SLAM-based system is the first SLAM-based system that is operable to alternate between using the first operational set of SLAM parameter values when navigating the first type of region and using the second operational set of SLAM parameter values when navigating the second type of region.

12. The method according to claim 10, further comprising detecting deterioration in performance of SLAM using the first operational set of SLAM parameter values, and based on the detection triggering navigation using the second operational set of SLAM parameter values.

13. A computerized system for configuring navigation computer code for SLAM-based system, the system comprising:

a processor; and non-tangible memory operable to store:

a three-dimensional (3D) model of a region of a first type of region;

a plurality of first-recording trajectories, each first-recording trajectory comprising an assessment of movement of a first visual data (VD) collector through the region during collection of a first VD recording by the first VD collector, wherein each first-recording trajectory is generated from the first VD recording by application of SLAM using a different corresponding set of SLAM parameter values out of a first plurality of sets;

a plurality of second-recording trajectories, each second-recording trajectory comprising an assessment of movement of a second VD collector through the region during collection of a second VD recording by the second VD collector, wherein each second-recording trajectory is generated from the second VD recording by application of SLAM using a different corresponding set of SLAM parameter values out of a second plurality of sets; and computer program code;

wherein the non-tangible memory and the computer program code are configured, with the at least one processor, to cause the computerized system to at least:
for each set of SLAM parameter values out of the first plurality of sets, generate a performance evaluation of a performance of the respective set of SLAM parameter values under a first operational conditions, based at least on accuracy of the respective first-recording trajectory with respect to the 3D model, thereby yielding a first plurality of performance evaluations pertaining to the first operational conditions;
for each set of SLAM parameter values out of the second plurality of sets, generate a performance evaluation of a performance of the respective set of SLAM parameter values under a second operational conditions, based at least on accuracy of the respective second-recording trajectory with respect to the 3D model, thereby yielding a second plurality of performance evaluations pertaining to the second operational conditions;
based at least on the first plurality of performance evaluations and on the second plurality of performance evaluations, determine an operational set of SLAM parameter values for a SLAM-based system; and
provide the operational set of SLAM parameter values to the SLAM-based system which is equipped with VD processor, for navigating within the first type of region by executing SLAM computer readable code by the VD processor using the operational set of SLAM parameter values.

14. The system according to claim 13, wherein a plurality of overlapping sets of SLAM parameter values is comprised in the first plurality of sets and in the second plurality of sets.

15. The system according to claim 13, wherein the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

16. The system according to claim 13, wherein the non-tangible memory and the computer program code are configured, with the at least one processor, to cause the computerized system to:
generate as part of the performance evaluations an accuracy evaluation and a resources consumption evaluation for each set out of a group of sets that comprises (a) at least one set out of the first plurality of sets and (b) at least one another set out of the second plurality of sets,
in the determining of the operational set of SLAM parameter values, balance between accuracy and resource consumption by the operational set of SLAM parameter values.

17. The system according to claim 13, wherein the first recording and the second recording are based on recorded VD collected by a sensor group comprising at least one VD sensor being installed on a navigable platform when the navigable platform traverses the region, wherein the 3D model is generated based on VD collected by at least one high-quality VD sensor installed on the navigable platform concurrently to the collection of the recorded VD.

18. The system according to claim 17, wherein the first VD recording is generated by downgrading VD collected by the at least one high-quality VD sensor.

19. The system according to claim 13, wherein the sets of the first plurality of sets and the sets of the second plurality of sets each comprise different values of: (a) maximal number of features to track, (b) degree of resolution downscaling for feature extraction, and (c) pose-graph loop closing parameters.

20. The system according to claim 13, wherein an only difference between the operational set of SLAM parameter values and a reference set of SLAM parameter values is that an allocation by the operational set of SLAM parameter values of a certain identifiable resource for performance of SLAM by the SLAM-based system is lower than an allocation by the reference set of SLAM parameter values of the certain identifiable resource for performance of SLAM by the SLAM based system, wherein execution of SLAM by the SLAM-based system based on the operational set of SLAM parameter values provides better SLAM accuracy with respect to the 3D model than execution of SLAM by the SLAM-based system based on the reference set of SLAM parameter values.

21. The system according to claim 13, wherein the non-tangible memory and the computer program code are configured, with the at least one processor, to cause the computerized system to avoid determining an operational set of SLAM parameter values whose execution results in at least one of: (a) power consumption of the VD processor that exceeds a predetermined power consumption criteria, and (b) heating of the VD processor that exceeds a predetermined heating criteria.

22. The system according to claim 13, wherein the non-tangible memory and the computer program code are further configured, with the at least one processor, to determine a plurality of operational sets of SLAM parameter values based on corresponding 3D models and VD recordings and on performance analysis of different sets of SLAM based parameters, and to provide the plurality of operational sets to at least one SLAM-based system for navigation within region of different types of regions, wherein each of the operational sets of parameters is usable for optimizing performance of SLAM by SLAM-based system of a class of SLAM-based systems for a different type of region out of the different types of regions.

23. A non-transitory computer-readable medium for configuring navigation computer code for a Simultaneous Localization and Mapping (SLAM) based system, comprising instructions stored thereon, that when executed on a processor, perform the steps of:
obtaining a three-dimensional (3D) model of a region of a first type of region;
acquiring a first recording of visual data (VD) by at least one first VD collector traversing the region at first operational conditions and a second recording of VD by at least one second VD collector traversing the region at second operational conditions;
applying SLAM to the first recording using a first plurality of sets of SLAM parameter values, thereby generating using each set of the first plurality of sets a corresponding first-recording trajectory assessing movement of the first VD collector within the region during the collection of the first VD recording;
for each set of SLAM parameter values out of the first plurality of sets, generating a performance evaluation of a performance of the respective set of SLAM parameter values under the first operational conditions, based at least on accuracy of the respective first-recording trajectory with respect to the 3D model, thereby yielding a first plurality of performance evaluations pertaining to the first operational conditions;

applying SLAM to the second recording using a second plurality of sets of SLAM parameter values, thereby generating using each set of the second plurality of sets a corresponding second-recording trajectory assessing movement of the second VD collector within the region during the collection of the second VD recording;

for each set of SLAM parameter values out of the second plurality of sets, generating a performance evaluation of a performance of the respective set of SLAM parameter values under the second operational conditions, based at least on accuracy of the respective second-recording trajectory with respect to the 3D model, thereby yielding a second plurality of performance evaluations pertaining to the second operational conditions;

based at least on the first plurality of performance evaluations and on the second plurality of performance evaluations, determining an operational set of SLAM parameter values for a SLAM-based system; and providing the operational set of SLAM parameter values to the SLAM-based system which is equipped with VD processor, for navigating within the first type of region by executing SLAM computer readable code by the VD processor using the operational set of SLAM parameter values.

24. The non-transitory computer-readable medium according to claim 23, wherein a plurality of overlapping sets of SLAM parameter values is comprised in the first plurality of sets and in the second plurality of sets.

25. The non-transitory computer-readable medium according to claim 23, wherein the operational set of SLAM parameter values outperforms a different operational set of SLAM parameter values in regions of the first type of region, wherein the different operational set of SLAM parameter values outperforms the operational set of SLAM parameter values in regions of a second type of regions, wherein the first type of region and the second type of region are different types of regions selected from a group of types of regions consisting of: indoor warehouse, indoor mall, outdoor area with roads.

26. The non-transitory computer-readable medium according to claim 23, wherein the generating of the performance evaluations for each set out of a group of sets that comprises at least one set out of the first plurality of sets and at least one another set out of the second plurality of sets comprises: generating an accuracy evaluation and a resources consumption evaluation, wherein the determining comprises balancing between accuracy and resource consumption by the operational set of SLAM parameter values.

27. The non-transitory computer-readable medium according to claim 23, wherein the first recording and the second recording are based on recorded VD collected by a sensor group comprising at least one VD sensor being installed on a navigable platform when the navigable platform traverses the region, wherein the 3D model is generated based on VD collected by at least one high-quality VD sensor installed on the navigable platform concurrently to the collection of the recorded VD.

28. The non-transitory computer-readable medium according to claim 23, wherein the first VD recording is generated by downgrading VD collected by the at least one high-quality VD sensor.

29. The non-transitory computer-readable medium according to claim 23, wherein the sets of the first plurality of sets and the sets of the second plurality of sets each comprise different values of: (a) maximal number of features to track, (b) degree of resolution downscaling for feature extraction, and (c) pose-graph loop closing parameters.

30. The non-transitory computer-readable medium according to claim 23, wherein an only difference between the operational set of SLAM parameter values and a reference set of SLAM parameter values is that an allocation by the operational set of SLAM parameter values of a certain identifiable resource for performance of SLAM by the SLAM-based system is lower than an allocation by the reference set of SLAM parameter values of the certain identifiable resource for performance of SLAM by the SLAM based system, wherein execution of SLAM by the SLAM-based system based on the operational set of SLAM parameter values provides better SLAM accuracy with respect to the 3D model than execution of SLAM by the SLAM-based system based on the reference set of SLAM parameter values.

31. The non-transitory computer-readable medium according to claim 23, wherein the determining comprises avoiding selection of sets of SLAM parameter values whose execution results in at least one of: (a) power consumption of the VD processor that exceeds a predetermined power consumption criteria, and (b) heating of the VD processor that exceeds a predetermined heating criteria.

32. A non-transitory computer-readable medium for configuring at least one navigation computer code for operation of SLAM-based systems in different types of regions, comprising instructions stored thereon, that when executed on a processor, perform the steps of:

executing operational instructions that comprise the instructions of claim 23, for providing a first operational set of SLAM parameter values to a first SLAM-based system which is equipped with a first VD processor, for navigating within a first type of region by executing SLAM computer readable code by the first VD processor using the first operational set of SLAM parameter values; and executing the operational instructions for a second type of region that is different than the first type of region, for providing a second operational set of SLAM parameter values to a second SLAM-based system which is equipped with a second VD processor, for navigating within the second type of region by executing SLAM computer readable code by the second VD processor using the second operational set of SLAM parameter values;

wherein the first SLAM-based system and the second SLAM-based system are functionally equivalent, wherein the first VD processor and the second VD processor are functionally equivalent;

wherein the first SLAM-based system outperforms the second SLAM-based system in regions of the first type of region, wherein the second SLAM-based system outperforms the first SLAM-based system in regions of the second type of region.

33. The non-transitory computer-readable medium according to claim 32, wherein the second SLAM-based system is the first SLAM-based system that is operable to alternate between using the first operational set of SLAM parameter values when navigating the first type of region and using the second operational set of SLAM parameter values when navigating the second type of region.

34. The non-transitory computer-readable medium according to claim 33, further comprising detecting deterioration in performance of SLAM using the first operational set of SLAM parameter values, and based on the detection triggering navigation using the second operational set of SLAM parameter values.

* * * * *